US012796576B2

(12) United States Patent
Pandya et al.

(10) Patent No.: US 12,796,576 B2
(45) Date of Patent: Nov. 10, 2026

(54) MULTI-DIE SEMICONDUCTOR PACKAGE

(71) Applicant: Infineon Technologies Austria AG, Villach (AT)

(72) Inventors: Bhargav Pandya, Gilbert, AZ (US); Chuan Cheah, Torrance, CA (US); Manuel Vorwerk, Villach (AT)

(73) Assignee: Infineon Technologies Austria AG, Villach (AT)

( * ) Notice: Subject to any disclaimer, the term of this patent is extended or adjusted under 35 U.S.C. 154(b) by 268 days.

(21) Appl. No.: 18/407,824

(22) Filed: Jan. 9, 2024

(65) Prior Publication Data

US 2025/0226295 A1 Jul. 10, 2025

(51) Int. Cl.

*H10W 90/00* (2026.01)
*H10W 70/40* (2026.01)
*H10W 74/00* (2026.01)

(52) U.S. Cl.

CPC ........ *H10W 90/811* (2026.01); *H10W 70/415* (2026.01); *H10W 90/00* (2026.01); *H10W 74/00* (2026.01); *H10W 90/753* (2026.01); *H10W 90/756* (2026.01); *H10W 90/792* (2026.01); *H10W 90/794* (2026.01)

(58) Field of Classification Search

CPC ............. H10W 70/415; H10W 70/421; H10W 70/461; H10W 70/466; H10W 70/481; H10W 72/00; H10W 72/20–29; H10W 72/50–59; H10W 72/90–987; H10W 90/00; H10W 90/753; H10W 90/756; H10W 90/792; H10W 90/794; H10W 90/811; H10W 70/411–442; H10W 70/464–467

See application file for complete search history.

(56) References Cited

U.S. PATENT DOCUMENTS

| | | | |
|---|---|---|---|
| 7,095,099 | B2 | 8/2006 | Oliver et al. |
| 10,699,976 | B1 | 6/2020 | Hoegerl et al. |
| 11,075,185 | B2 | 7/2021 | Hong et al. |
| 11,075,785 | B2 | 7/2021 | Bagheri et al. |
| 11,815,533 | B2 | 11/2023 | Houis |
| 2008/0087992 | A1 | 4/2008 | Shi et al. |
| 2009/0072368 | A1 | 3/2009 | Hu et al. |

(Continued)

FOREIGN PATENT DOCUMENTS

| | | | | |
|---|---|---|---|---|
| CN | 112447612 A * | 3/2021 | .......... | H10W 90/811 |
| DE | 102009054892 A1 | 7/2010 | | |

(Continued)

*Primary Examiner* — Scott B Geyer

(74) *Attorney, Agent, or Firm* — Murphy, Bilak & Homiller, PLLC

(57) ABSTRACT

A semiconductor package includes a carrier having a die pad and a plurality of leads, a first discrete power device die mounted on the die pad and having a first load terminal pad disposed on a main surface that faces away from the die pad, a first package load terminal formed by one or more of the leads, and a first metal clip that electrically connects the first load terminal pad of the first discrete power device die with the first package load terminal, wherein the first metal clip comprises a local constriction that is configured to locally reduce a heat conductance of the first metal clip in a section of the first metal clip that is between the first discrete power device die and the first package load terminal.

26 Claims, 20 Drawing Sheets

(56) References Cited

U.S. PATENT DOCUMENTS

| | | | | |
|---|---|---|---|---|
| 2013/0256856 | A1* | 10/2013 | Mahler | H10W 20/056 257/676 |
| 2014/0218885 | A1 | 8/2014 | Hosseini et al. | |
| 2016/0014916 | A1 | 1/2016 | Ausserlechner et al. | |
| 2017/0117208 | A1 | 4/2017 | Kasztelan et al. | |
| 2017/0317015 | A1* | 11/2017 | Lee | H10W 70/411 |
| 2018/0108600 | A1* | 4/2018 | Kamiyama | H10W 70/041 |
| 2019/0385931 | A1 | 12/2019 | Eid et al. | |
| 2020/0066546 | A1* | 2/2020 | Kawashima | H10W 70/02 |
| 2020/0312750 | A1* | 10/2020 | Shirai | H02M 3/158 |
| 2021/0313243 | A1* | 10/2021 | McPherson | H02M 7/003 |
| 2021/0384111 | A1 | 12/2021 | Voss et al. | |
| 2022/0130773 | A1* | 4/2022 | Pun | H10W 40/778 |
| 2022/0149038 | A1 | 5/2022 | Fuergut et al. | |
| 2022/0223544 | A1* | 7/2022 | Fukuoka | H10W 42/121 |
| 2023/0361009 | A1* | 11/2023 | Wang | H10W 70/481 |
| 2023/0378018 | A1* | 11/2023 | Okuda | H10D 30/668 |
| 2024/0087995 | A1* | 3/2024 | Otremba | H10W 70/429 |
| 2025/0054840 | A1* | 2/2025 | Grassmann | H10W 70/413 |
| 2026/0157189 | A1* | 6/2026 | Liu | H10W 70/047 |

FOREIGN PATENT DOCUMENTS

| | | | | |
|---|---|---|---|---|
| DE | 102013100156 | A1 | 7/2013 | |
| DE | 112014004058 | T5 | 6/2016 | |
| EP | 3522213 | A1 * | 8/2019 | H10W 90/701 |
| WO | 2013047671 | A1 | 4/2013 | |
| WO | WO-2022226142 | A1 * | 10/2022 | H10W 70/658 |

* cited by examiner

MULTI-DIE SEMICONDUCTOR PACKAGE

BACKGROUND

Many applications such as automotive and industrial applications utilize power devices to perform switching of high voltages and conduction of high currents. Power devices refer to semiconductor devices capable of blocking voltages of at least 100V (volts), and more typically on the order of 600V or more and/or semiconductor devices capable of conducting currents of least 1 A (amperes), and more typically on the order of 10 A or more. Semiconductor packages with modern power devices that are designed to minimize power losses can provide power efficient solutions to reduce or prevent anthropogenic emissions of greenhouse gases (GHG). For instance, discrete power switching devices can be used in hybrid electric or purely electric vehicles to switch large amounts of current and/or voltage. More generally, modern power devices can be incorporated into any into any electrical setting to improve efficiency and reduce environmental impact. There is a strong need to improve the performance, cost and efficiency of power device packages and consequently improve the efficiency of power delivery systems.

SUMMARY

Those skilled in the art will recognize additional features and advantages upon reading the following detailed description, and upon viewing the accompanying drawings.

A semiconductor package is disclosed. According to an embodiment, the semiconductor package comprises a carrier comprising a die pad and a plurality of leads; first and second switching device dies, each comprising a gate terminal pad and first and second load terminal pads disposed on a main surface; and a first package load terminal, a second package load terminal, and a package gate terminal, each of which are formed by one or more of the leads, wherein the first and second switching device dies are each configured as discrete type III-V semiconductor devices, wherein the first and second switching device dies are each mounted on the die pad with the main surfaces from each switching device die facing away from the die pad, wherein the first and second switching device dies are electrically connected in parallel, whereby: a first electrical interconnection electrically connects the first load terminal pads from the first and second switching device dies with the first package load terminal; a second electrical interconnection electrically connects the second load terminal pads from the first and second switching device dies with the second package load terminal; and a third electrical interconnection electrically connects the gate terminal pads from the first and second switching device dies with the package gate terminal.

According to another embodiment, the semiconductor package comprises a carrier comprising a die pad and a plurality of leads; and a first discrete power device die mounted on the die pad and comprising a first load terminal pad disposed on a main surface that faces away from the die pad; a first package load terminal formed by one or more of the leads; and a first metal clip that electrically connects the first load terminal pad of the first discrete power device die with the first package load terminal, wherein the first metal clip comprises a local constriction that is configured to locally reduce a heat conductance of the first metal clip in a section of the first metal clip that is between the first discrete power device die and the first package load terminal.

An electrical interconnect element is disclosed. According to an embodiment, the electrical interconnect element comprises a metal clip extending between a first end and a second end; a local constriction arranged between the first end and the second end, wherein the metal clip is configured to interface with a semiconductor die at the first end and with a carrier at the second end, and wherein the local constriction is configured to locally reduce a heat conductance of the metal clip in a section of the metal clip that is between the first end and the second end.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of semiconductor package with parallel connected dies and advantageous electrical interconnect configurations for connecting the dies with the package leads are described herein. The semiconductor package includes two or more discrete switching device dies that are connected in parallel to create a switching device with high current capacity. In comparison to a single die configuration with comparable conduction capacity, a parallel connected multi-die configuration offers notable advantages, such as improved yields and lower occurrence of defects, improved heat dissipation, and lower chance of die chipping. However, multi-die configurations come with some drawbacks such as interconnect congestion and potentially asymmetric switching behavior. The embodiments disclosed herein advantageously mitigate these issues. For instance, the embodiments disclosed herein match the impedance and/or resistance of the package interconnections, thereby facilitating synchronous switching behavior. Moreover, the embodiments disclosed herein include die configurations and/or interconnect features and arrangements that relieve interconnect congestion.

Embodiments of the semiconductor package may include metal clips with advantageous heat flow restriction features. The parallel connected device dies conduct high currents and operate at high voltages during operation and consequently generate significant heat during operation. According to embodiment, at least one metal clip from the semiconductor package that accommodates a load current of the device comprises a local constriction that is configured to locally reduce the heat conductance of the metal clip. This provides a beneficial trade-off between electrical conductivity and heat conductivity. That is, the metal clip has a beneficially low electrical resistance in comparison to other interconnect element types, e.g., bond wires, ribbons, etc. Meanwhile, the local constriction provides a partial heat transfer barrier that prevents efficient transference of the die surface temperate to the leads, thereby avoiding problems such as the destruction of the connections between the leads and the external device.

Figure 1:
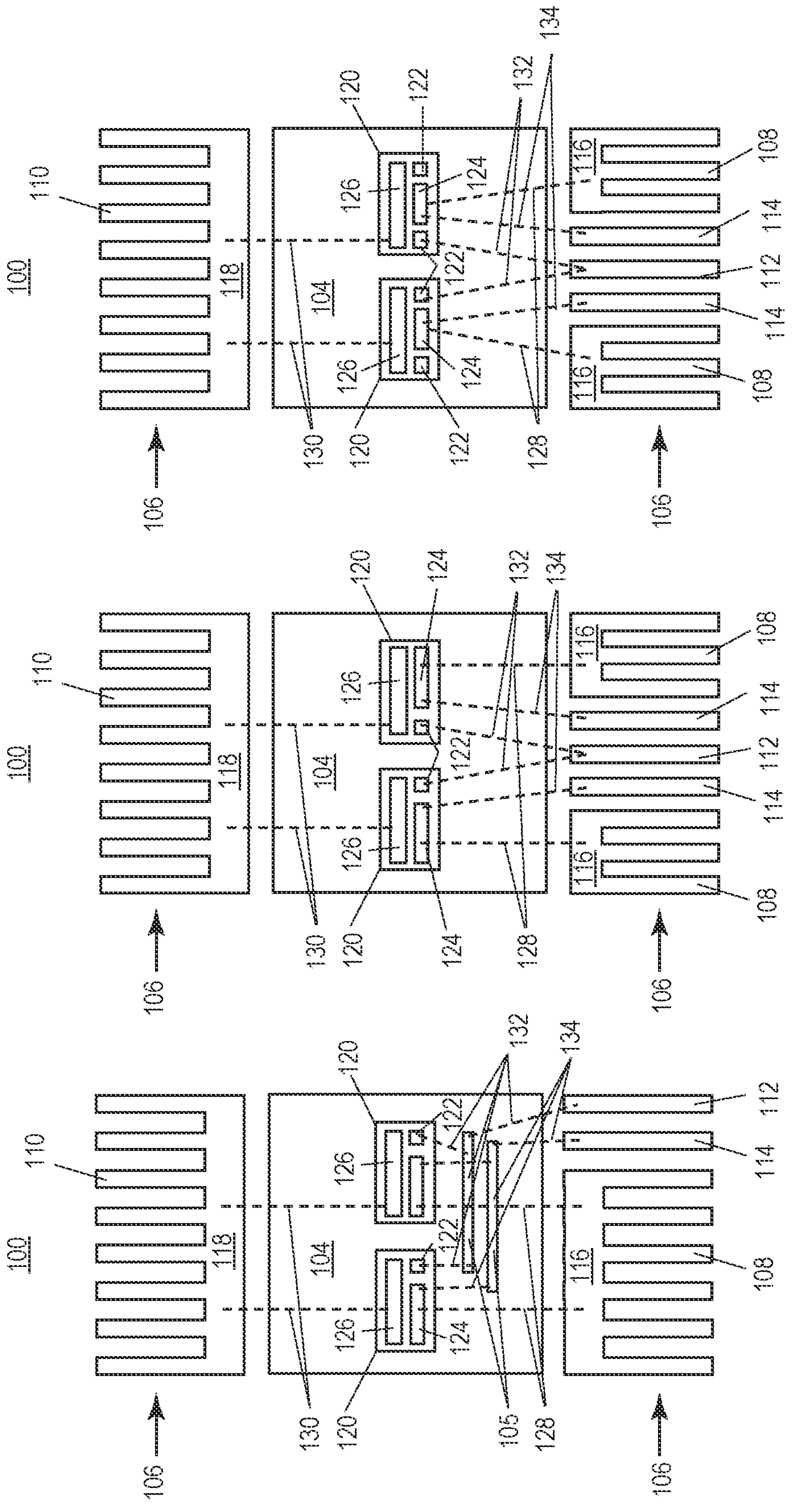
FIG. 1 schematically illustrates a semiconductor package assembly with multiple switching device dies connected in parallel with one another, according to an embodiment.

Referring to FIG. 1, a semiconductor package assembly 100 is shown, according to an embodiment. The semiconductor package assembly 100 comprises a carrier comprising a die pad 104 and a plurality of leads 106 that extend away from the die pad 104. According to an embodiment, the carrier is provided from a metal lead frame. This lead frame may be formed from one or more conductive metals such as Cu, Ni and/or Ag, for example. Additionally, the features of the lead frame may include or be plated with Cu, Ni, Ag, Au, Pd, Pt, NiV, NiP, NiNiP, NIP/Pd, Ni/Au, NiP/Pd/Au, or NiP/Pd/AuAg, for example. The lead frame may be provided from a uniform thickness planar sheet metal and processed by metal processing techniques, e.g., stamping, cutting, etching, etc. According to an embodiment, at least the die pad 104 portion of the carrier is provided from an insulated electronics substrate. In that case, the carrier may comprise an electrically insulating substrate region formed from, e.g., ceramic, FR-4, etc., with a structured metal layer disposed thereon. Examples of insulated electronics substrates include PCBs (printed circuit boards) or power electronics carriers such as DOBs (direct copper bonded) substrates, IMS (insulated metal) substrates, AMB (active metal brazed) substrates, or substrates with 3D printed insulation layers and metal layers formed thereon.

The leads 106 form the externally accessible terminals of the completed semiconductor package. The depicted semiconductor package assembly 100 is configured with four external terminals, namely, a first package load terminal(s) 108, a second package load terminal 110, a package gate terminal 112, and a package sense terminal(s) 114. The first and second package load terminals 108, 110 accommodate the rated voltage and current of the device. The package gate terminal 112 is used to control the switching operation of the device. The package sense terminal 114 is used to measure the voltage present at the load terminals of the dies. Each of the package terminals may be formed by one or more of the leads 106. As shown, the first package load terminal 108 and the second package load terminal 110 are each formed by a plurality of the leads 106. The carrier comprises a first landing pad(s) 116 that is configured to receive an electrical interconnect element, e.g., clip, ribbon, bond wire, etc., and forms a merged connection between the leads 106 which form the first package load terminal(s) 108. Correspondingly, the carrier comprises a second landing pad 118 that is configured to receive an electrical interconnect element, e.g., clip, ribbon, bond wire, etc., and forms a merged connection between the leads 106 which form the second package load terminal 110. The number of leads 106 for each of the package terminals may vary from what is shown and may depend on a variety of factors including operational voltage and current, package footprint, creepage and clearance requirements, etc. Separately or in combination, the lead configuration and corresponding package style may vary from what is shown. For example, a package assembly may be configured for a variety of different package styles including leaded package, leadless packages, SMDs (surface mount devices), through-hole packages, etc.

The semiconductor package assembly 100 comprises a plurality of discrete switching device dies 120 mounted on the die pad 104. In the depicted embodiment, the semiconductor package assembly 100 comprises two discrete switching device dies 120 mounted on the die pad 104. More generally, the semiconductor package assembly 100 may comprise any plurality of discrete switching device dies 120, e.g., two, three, four, five, six, etc. mounted on the same die pad 104 and connected in parallel with one another according to the techniques disclosed herein. The discrete switching device dies 120 may be formed in various semiconductor material technologies such as technologies of group IV semiconductors, IV-IV compound semiconductor material, III-V compound semiconductor material, or II-VI compound semiconductor material. Examples of semiconductor devices formed in group IV semiconductor technologies include devices formed in silicon (Si), silicon carbide (SIC), and germanium (Ge). Examples of semiconductor devices formed III-V compound semiconductor material technologies include, inter alia, gallium arsenide (GaAs), gallium nitride (GaN), gallium phosphide (GaP), indium phosphide (InP), indium gallium nitride (InGaN) and indium gallium arsenide (InGaAs).

The discrete switching device dies 120 comprise a gate terminal pad 122 and first and second load terminal pads 124, 126. In a conventionally known manner, the discrete switching device dies 120 are configured to a control conductive connection between the first and second load terminal pads 124, 126 via the gate terminal pad 122. According to an embodiment, the discrete switching device dies 120 are configured as discrete HEMT (high-electron mobility transistor) dies. In that case, the first load terminal pad 124 may correspond to a source terminal and the second load terminal pad 126 may correspond to a drain terminal, or vice-versa. According to another embodiment, the discrete switching device dies 120 are configured as bidirectional switches. In that case, the discrete switching device dies 120 may comprise an a second (different) gate terminal pad and the semiconductor package assembly 100 may likewise include a second (different) package gate terminal (not shown in FIG. 1) connected thereto, wherein these devices are configured for two-way conduction through selective biasing of each gate terminal pad. In a particular embodiment, the discrete switching device dies 120 are configured as discrete GaN devices dies, wherein the active channel of the device is formed by a heterojunction between layers of GaN and alloys thereof such as AlGaN. These GaN devices dies may be configured as discrete HEMT dies of bidirectional switch dies, for example.

The gate terminal pad 122 and first and second load terminal pads 124, 126 are each formed on main surfaces of the discrete switching device dies 120. Thus, the discrete switching device dies 120 are configured as lateral devices that conduct in a direction parallel to the main surface of the device. Optionally, the discrete switching device dies 120 may comprise a substrate connection terminal (not shown in FIG. 1). The substrate connection terminal may be used to maintain the substrate of the die at a fixed potential, e.g., source potential. The substrate connection terminal may be provided on the main surface of the die or on the rear surface of the die. If provided on the rear surface of the die, the substrate connection terminal may be electrically connected to the die pad 104 by a conductive adhesive, e.g., sinter, solder, etc.

The semiconductor package assembly 100 is configured such that each of the discrete switching device dies 120 are electrically connected in parallel. That is, the semiconductor package is configured to operate as a single switching device from the perspective of the externally accessible terminals. The parallel configuration of the semiconductor package is realized by package level electrical interconnections between the discrete switching device dies 120 and the leads 106. These electrical interconnections are schematically depicted in FIG. 1. In general, each electrical interconnection may be effectuated using any type of package interconnect element, e.g., metal interconnect clips, ribbon, bond wire, etc. Furthermore, these electrical interconnections may comprise one or more conductive runners 105. The conductive runners 105 may be formed by elongated metal strips or tracks that run along the die attach surface of the die pad 104. The conductive runners 105 may be provided by separate metal structures, e.g., structures formed from copper, aluminum, and alloys thereof, that are mounted on the die pad 104. If electrical isolation with the die pad 104 is required, the separate metal structures may be attached using an electrically insulating adhesive, e.g., insulating tape, epoxy, etc. The electrically insulating adhesive can be provided by multiple globs of material epoxy that separate the metal structure from the die pad 104 or by a continuous strip of material, e.g., insulating tape, arranged between the metal structure and the die pad 104. If electrical connection with the die pad 104 is required, the separate metal structures may be attached using a conductive adhesive, e.g., solder, sinter, conductive glue, etc. In the case that the die pad 104 is part of or formed by an insulated electronics substrate, e.g., PCB, DCB, IMS, AMB, etc., the conductive runners 105 may also be formed by metal tracks that are formed on a surface of the insulated electronics substrate, and electrical isolation may be provided by the underlying electrically insulating substrate region.

The semiconductor package includes the following electrical interconnections. A first electrical interconnection 128 electrically connects the first load terminal pads 124 from each of the discrete switching device dies 120 with the first package load terminal 108. A second electrical interconnection 130 electrically connects the second load terminal pads 126 from each of the discrete switching device dies 120 with the second package load terminal 110. A third electrical interconnection 132 electrically connects the gate terminal pad 122 from each of the discrete switching device dies 120 with the package gate terminal 112. A fourth electrical interconnection 134 electrically connects the first load terminal pads 124 from each of the discrete switching device dies 120 with the package sense terminal 114.

According to an embodiment, the third electrical interconnection 132 is configured such that a resistance of a first gate connection that electrically connects the gate terminal pad 122 from a first one of the discrete switching device dies 120 with the package gate terminal 112 substantially matches a resistance of a second gate connection that electrically connects the gate terminal pad 122 from a second one of the discrete switching device dies 120 with the package gate terminal 112. That is, the gate connections for each of the discrete switching device dies 120 are resistance matched to one another. This resistance matching facilitates synchronous switching behavior between the two discrete switching device dies 120. The third electrical interconnection 132 may be further configured such the inductance, capacitance or overall impedance of the first and second gate connections substantially match one another, thereby further facilitating synchronous switching behavior.

The resistance matching and/or impedance matching of the first and second gate connections may be achieved through configuration and arrangement of the interconnect elements and conductive runners 105 (if present) that are used to form the third electrical interconnection 132. For example, in an embodiment wherein each of the first and second gate connections are formed by electrical interconnect elements, the total length of the electrical interconnect elements which form the first gate connection may substantially match the total length of the electrical interconnect elements which form the second gate connection. More particularly, the first gate connection may comprise a first bond wire that directly connects the gate terminal pad 122 from the first one of the discrete switching device dies 120 with the package gate terminal 112 and a second bond wire that directly connects the gate terminal pad 122 from the second one of the discrete switching device dies 120 with the package gate terminal 112, and the first and second bond wires can be substantially equal in length, thereby creating a resistance matched electrical connection. In the case that one or both of the first and second gate connections comprise multiple bond wires, the total length of the bond wires, i.e., the sum of the length of each bond wire, for each connection may be substantially matched. In the case that the third electrical interconnection 132 comprises a conductive runner 105 and the first and second gate connections comprise bond wires that contact the conductive runner 105 at different locations, the length of the bond wires may be close or identical to one another. In some cases, there may be a slight discrepancy between the total length of the bond wires connected between the dies and the conductive runner 105 to account for different contact points of the bond wires.

Along similar lines, any one of the first, second, and fourth electrical interconnections 128, 130, 134 may also be configured such that the electrical resistance and/or impedance of the respective connection is matched as between two or more of the discrete switching device dies 120. In an embodiment, the first electrical connection may comprise a first metal clip that electrically connects the first load terminal pad 124 from a first one of the discrete switching device dies 120 with the first package load terminal 108, and a second metal clip that electrically connects the first load terminal pad 124 from a second one of the discrete switching device dies 120 with the first package load terminal 108, wherein the first and second metal clips are substantially identical in length, and may be completely identical to one another. Correspondingly, the second electrical connection may comprise a third metal clip that electrically connects the second load terminal pad from a first one of the discrete switching device dies 120 with the second package load terminal 110, and a fourth metal clip that electrically connects the second load terminal pad from a second one of the discrete switching device dies 120 with the second package load terminal 110, wherein the third and fourth metal clips are substantially identical in length, and may be completely identical to one another. The fourth electrical interconnection 134 may be effectuated using the same electrical interconnect elements as the third electrical interconnection 132 and may be resistance and/or impedance matched in a similar manner as the third electrical interconnection 132.

In the semiconductor package assembly 100 on the left side of FIG. 1, the third and fourth electrical interconnections each 132, 134 comprise a conductive runner 105. By providing the conductive runner 105 on the die pad 104, the third and fourth electrical interconnections 132, 134 may be routed underneath at least one of the electrical interconnect elements used to form the first electrical interconnection 132. This allows for improved space efficiency and facilitates impedance and/or resistance matching of the third and fourth electrical interconnections 132, 134, e.g., through selection of electrical interconnect length between the dies and the conductive runner 105. The third electrical interconnection 132 may comprise a first electrical interconnect element that electrically connects the gate terminal pad 122 from a first one of the discrete switching device dies 120 with one of the conductive runners, a second electrical interconnect element that electrically connects the gate terminal pad 122 from a second one of the discrete switching device dies 120 with one of the conductive runners. The length and/or resistance of the first and second electrical interconnect elements may be adjusted to create an impedance matched connection.

In the semiconductor package assembly 100 in the middle of FIG. 1, the discrete switching device dies 120 mounted adjacent one another have different pad geometries, i.e., the geometric arrangement of the gate terminal pad 122 and first and second load terminal pads 124, 126 from a first one of the discrete switching device dies 120 on the left side semiconductor package assembly 100 is different from the geometric arrangement of the gate terminal pad 122 and first and second load terminal pads 124, 126 from a second one of the discrete switching device dies 120 on the right side semiconductor package assembly 100. In this case, the pad geometry of the first one of the discrete switching device dies 120 is mirrored relative to the pad geometry of the second one of the discrete switching device dies 120. That is, the two pad geometries are reversed about an axis of symmetry running vertically through the center of each die. Moreover, each discrete switching device die has an asymmetric pad geometry wherein the gate terminal pad 122 is disposed at one side of the respective device die. This allows for an arrangement whereby the gate terminal pad from 122 the first one of discrete switching device dies 120 and the gate terminal pad from 122 from the second one of the discrete switching device dies 120 are positioned adjacent to sides of the first and second discrete switching device dies 120 that face one another. Consequently, these gate terminal pads 122 can be readily accessed from within a central region of the semiconductor package assembly 100 that is between the interconnect elements used to form the first electrical interconnection 132. The lead configuration of the carrier is adapted accordingly such that the lead 106 forming the package gate terminal 112 and the lead 106 forming the package sense terminal 114 are arranged between two groups of leads 106, each forming the first package load terminal 108.

In the semiconductor package assembly 100 in the middle of FIG. 1, the third electrical interconnection 132 can be effectuated without the use of conductive runners 105. A first gate connection can be effectuated by a first electrical interconnect element that directly connects the gate terminal pad 122 from the first one of the discrete switching device dies 120 with the package gate terminal 112 and a second electrical interconnect element that directly connects the gate terminal pad 122 from the second one of the discrete switching device dies 120 with the package gate terminal 112. The fourth electrical interconnection 134 likewise can be effectuated without the use of conductive runners 105.

In the semiconductor package assembly 100 on the right side of FIG. 1, the discrete switching device dies 120 mounted adjacent one another have the same pad geometries. Further, these discrete switching device dies 120 may be identical devices. In this case, the pad geometries from the discrete switching device dies 120 are configured with two of the gate terminal pads 122 disposed on opposite sides of the die. That is, the discrete switching device dies 120 are configured such that the gate can be accessed from either side of the die. In this way, the semiconductor package assembly 100 may be configured such that a gate terminal pad from 122 the first one of discrete switching device dies 120 and a gate terminal pad from 122 from the second one of the discrete switching device dies 120 are positioned adjacent to sides of the first and second discrete switching device dies 120 that face one another. Consequently, the semiconductor package assembly 100 may have a similar interconnect arrangement as the semiconductor package in the middle of FIG. 1 with all of the interconnect elements forming the third and fourth electrical interconnections 132, 134 disposed within a central region of the semiconductor package. By having discrete switching device dies 120 with the same pad geometry, processing costs may be relatively lower as the same exact device may be used. On the other hand, since a small amount of pad size for the second gate terminal pad 122 is sacrificed, the semiconductor package assembly 100 in the middle of FIG. 1 may be preferable for lowered load terminal resistance.

In addition to the two die arrangements specifically shown in FIG. 1, semiconductor package assemblies 100 may include package include configurations with more than two switching device dies, wherein each switching device die is connected in parallel with one another between the package device terminals. In one particular example of this, the semiconductor package assembly 100 may comprise four of the discrete switching device dies 120, namely, first, second, third and fourth ones of the discrete switching device dies 120, wherein the first, second, third and fourth discrete switching device dies 120 are each electrically connected in parallel, whereby the first electrical interconnection 128 electrically connects the first load terminal pads 124 from the first, second, third and fourth discrete switching device dies 120 with the first package load terminal 108, the second electrical interconnection 130 electrically connects the second load terminal pads from the first, second, third and fourth discrete switching device dies 120 with the second package load terminal 110, the third electrical interconnection 132 electrically connects the gate terminal pads from the first, second, third and fourth discrete switching device dies 120 with the package gate terminal 112, and the fourth electrical interconnection electrically connects the first load terminal pads 124 from the first, second, third and fourth discrete switching device dies 120 with the package sense terminal 114. In this example, each of the first, second, third, and fourth electrical interconnections 128, 130, 132 and 134 may be effectuated according to any of the techniques/configurations described above.

Figure 15:
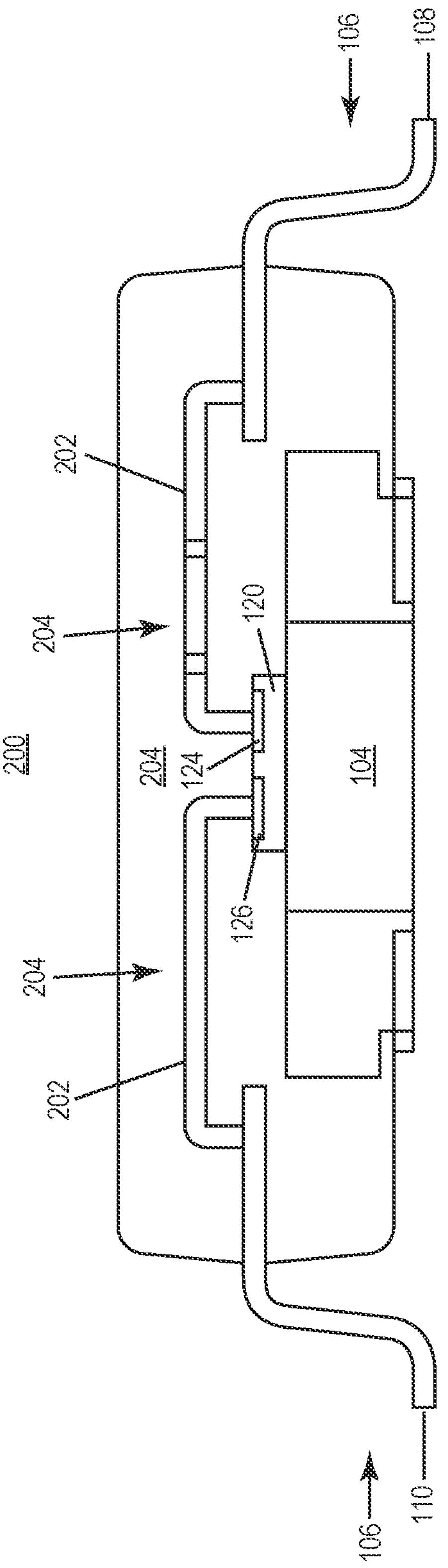
FIG. 15 illustrates a cross-sectional view of semiconductor package with multiple switching device dies connected in parallel with one another, according to an embodiment.

After mounting the dies and forming the electrical interconnections, and encapsulation process may be formed to cover the die pad 104, the discrete switching device dies 120 and the electrical interconnect elements may be encapsulated with an electrically insulating encapsulant body 205, e.g., as shown in FIG. 15. Meanwhile, outer ends of the leads 106 remain exposed from the electrically insulating encapsulant body 205 forming externally accessible package terminals. The encapsulation process may include forming an electrically insulating mold compound, e.g., by injection molding, transfer molding, compression molding, etc. A dicing process may be performed to form a complete semiconductor package.

Figure 2:
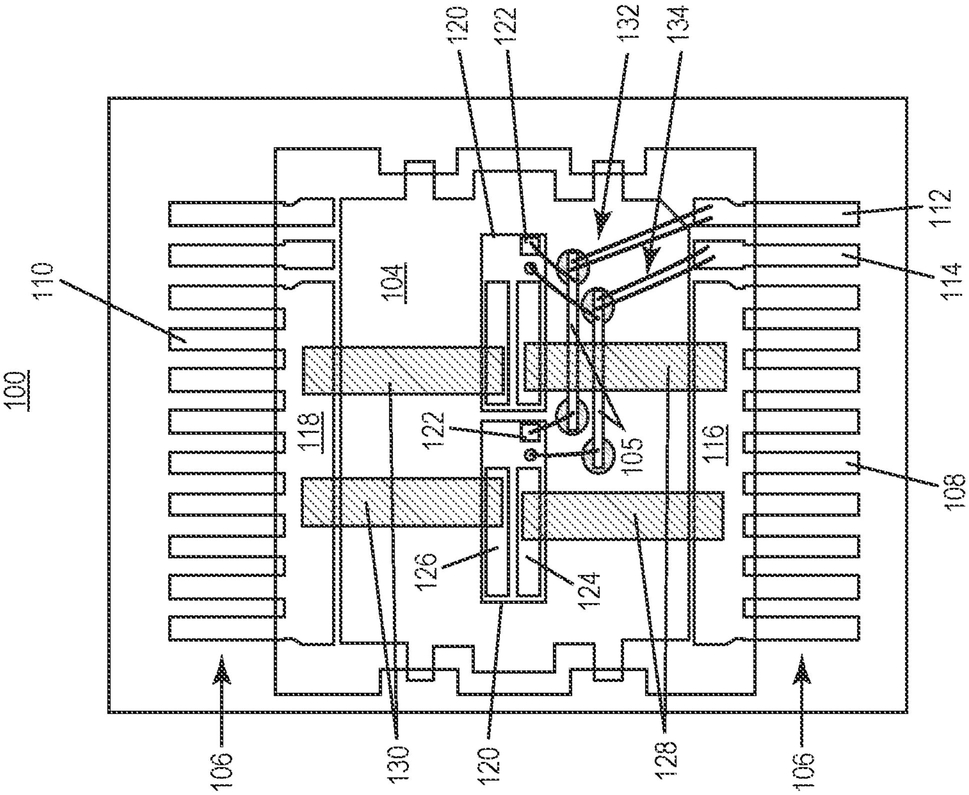
FIGS. 2-14 each illustrate embodiments of a semiconductor package assembly with multiple switching device dies connected in parallel with one another.

Referring to FIG. 2, a semiconductor package assembly 100 is depicted, according to an embodiment. The semiconductor package assembly 100 comprises a pair of discrete switching device dies 120 mounted side-by-side one another. Each of the discrete switching device dies 120 has an asymmetric pad geometry wherein the gate terminal pad 122 is disposed at one side of the respective device die. The discrete switching device dies 120 may be identical to one another. The discrete switching device dies 120 are electrically connected in parallel with one another by the first, second third and fourth electrical interconnections 128, 130, 132, 134. In this case, the first and second electrical interconnections 128, 130 are effectuated by metal clips. In particular, the first electrical interconnection 128 comprises a first metal clip that electrically connects the first load terminal pad 124 from the first discrete switching device die 120 with the first package load terminal 108 and a second metal clip that electrically connects the first load terminal pad 124 from the second discrete switching device die 120 with the first package load terminal 108. Meanwhile, the second electrical interconnection 130 comprises a third metal clip that electrically connects the second load terminal pad 126 from the first discrete switching device dies 120 with the second package load terminal 110 and a fourth metal clip that electrically connects the second load terminal pad 126 from the second discrete switching device die 120 with the second package load terminal 110. The third and fourth electrical interconnections 132, 134 of the semiconductor package assembly 100 comprise conductive runners 105 bonded to the die pad 104 by an electrically insulating adhesive, e.g., an epoxy. These conductive runners 105 both run underneath and are spaced apart from the first metal clip from the first electrical interconnection 128.

Figure 3:
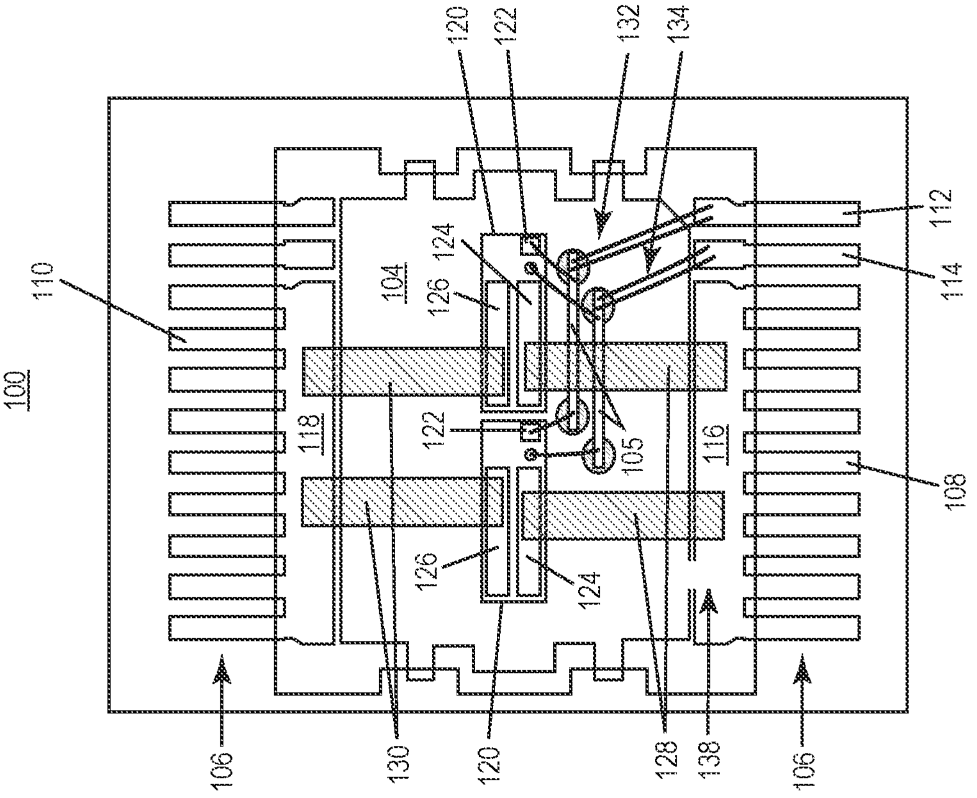

Referring to FIG. 3, a semiconductor package assembly 100 is depicted, according to another embodiment. Different to the embodiment of FIG. 2, the semiconductor package assembly 100 of FIG. 3 comprises a direct connection 138 between the die pad 104 and the first landing pad 116. This direct connection places the die pad 104 at the same potential as the first package load terminal 108. In this case, the discrete switching device dies 120 may comprise a substrate connection terminal disposed on the rear surface of the die that is electrically connected to the die pad 104 by a conductive adhesive, e.g., sinter, solder, etc.

Figure 4:
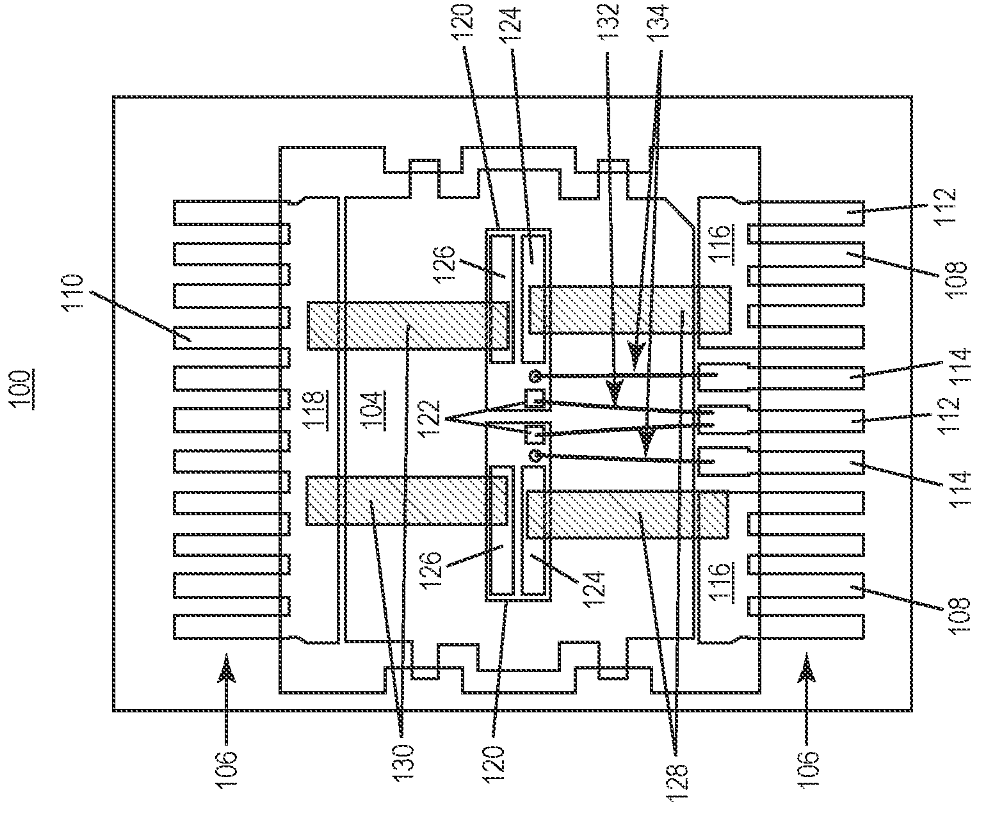

Referring to FIG. 4, a semiconductor package assembly 100 is depicted, according to another embodiment. Different to the embodiment of FIG. 3, the semiconductor package assembly 100 of FIG. 3 is configured such that the discrete switching device dies 120 mounted adjacent one another have asymmetric pad geometry whereby the gate terminal pad 122 is disposed at one side of the respective device die. Moreover, the pad geometry of a first one of the discrete switching device dies 120 (e.g., on the left side of the figure) is mirrored relative to the pad geometry of a second one of the discrete switching device dies 120 (e.g., on the right side of the figure). As a result, the gate terminal pads 122 of both discrete switching device dies 120 are arranged closely together in a central region of the semiconductor package assembly 100. In this embodiment, the third electrical interconnection 132 comprises a first gate connection that is formed by a bond wire that is directly connected between the bond pad from the first one of the discrete switching device dies 120 and the package gate terminal 112 and a second gate connection that is formed by a bond wire that is directly connected between the bond pad from the second one of the discrete switching device dies 120 and the package gate terminal 112. These two bond wires may be configured to be substantially equal in length, thereby substantially matching the resistance of the first and second gate connections.

Figure 5:
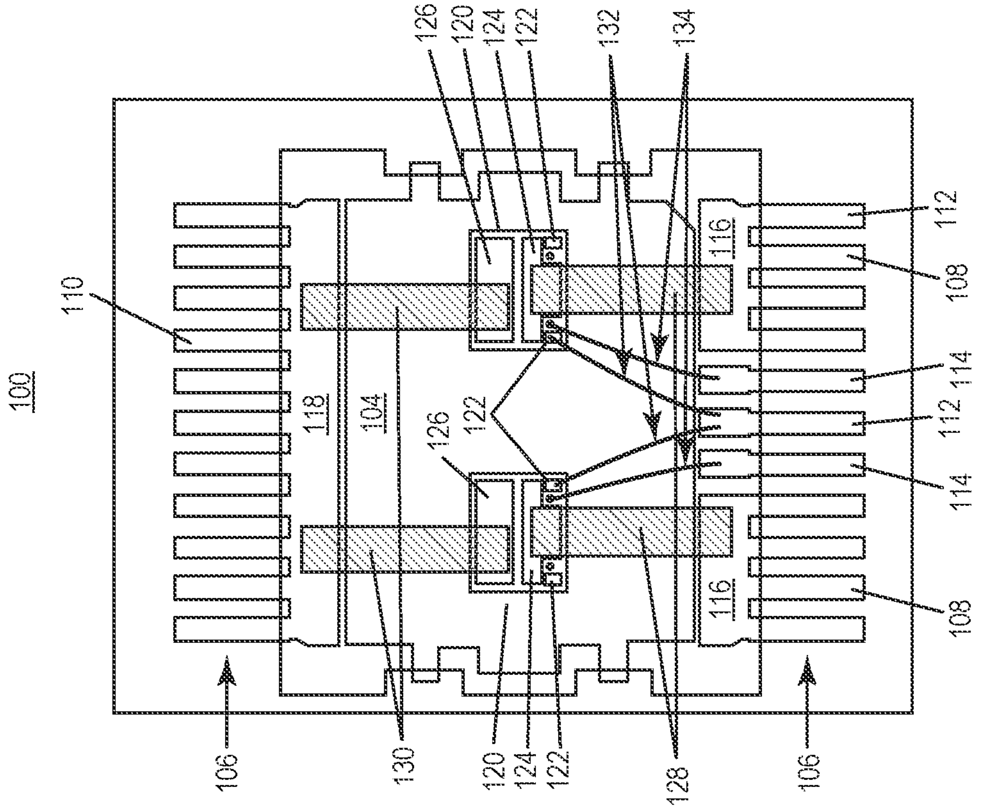

Referring to FIG. 5, a semiconductor package assembly 100 is depicted, according to another embodiment. Different to the embodiment of FIG. 4, the semiconductor package assembly 100 of FIG. 5 is configured such that the discrete switching device dies 120 mounted adjacent one another have the same pad geometries. The two discrete switching device dies 120 may be identical to one another. In this case, the pad geometries from the discrete switching device dies 120 are configured with two of the gate terminal pads 122 disposed on opposite sides of the die. As a result, the first gate connection is formed by a first bond wire directly connecting a first gate terminal pad 122 from the first discrete switching device die 120 die with the package gate terminal 112 and the second gate connection is formed by a second bond wire directly connecting a second gate terminal pad 122 from the first discrete switching device die 120 with the package gate terminal 112, and the first and second gate connections may be arranged in a central region of the semiconductor package assembly 100 in between the first and second metal clips in a similar manner as described above.

Figure 6:
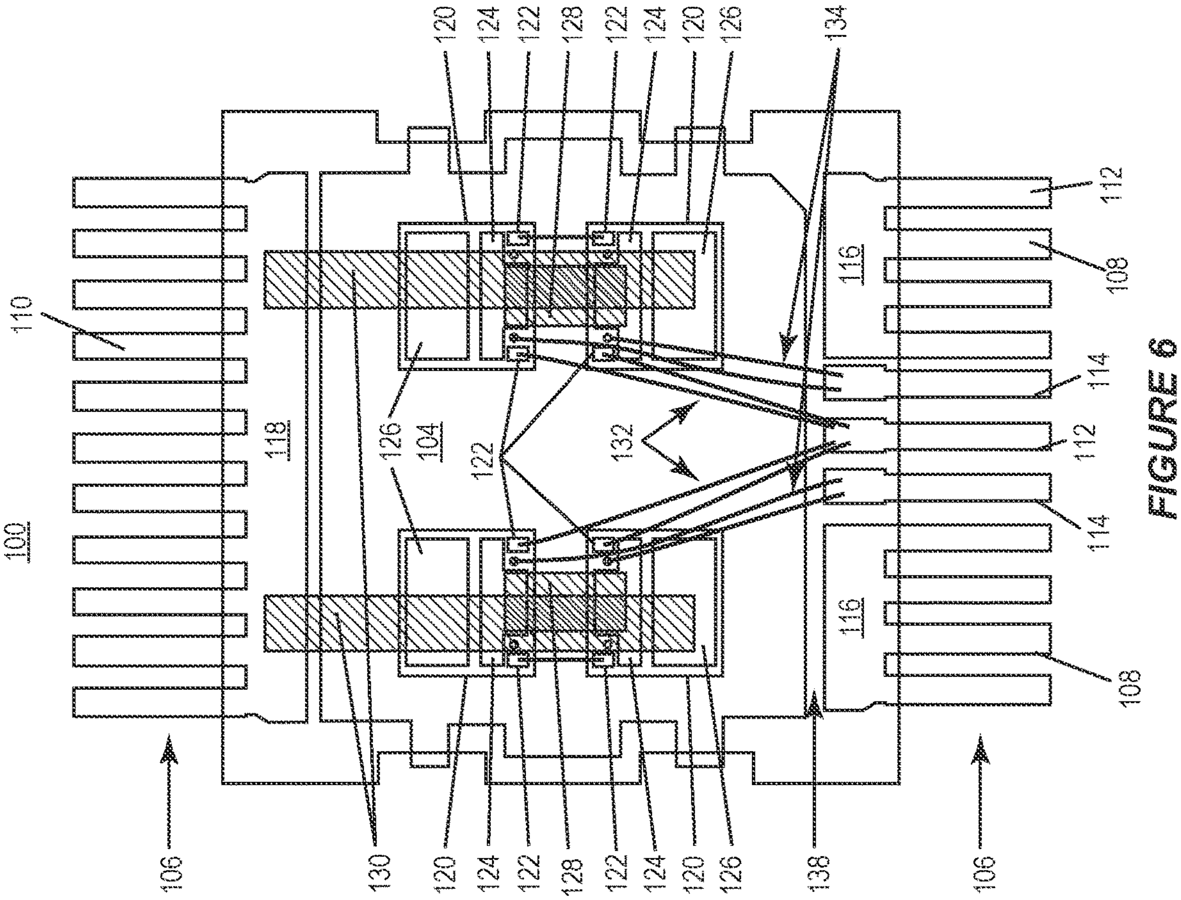

Referring to FIG. 6, a semiconductor package assembly 100 is depicted, according to another embodiment. Similar to the embodiment of FIG. 5, the semiconductor package assembly 100 of FIG. 6 is configured such that the discrete switching device dies 120 mounted adjacent one another have the same pad geometries and each are configured with two of the gate terminal pads 122 disposed on opposite sides of the die. In this case, the semiconductor package assembly 100 comprises four of the discrete switching device dies 120 in total, wherein two pairs of the device dies are mounted side-by-side on another in a similar manner as described above. The semiconductor package assembly 100 is configured such that all four of the discrete switching device dies 120 are connected in parallel with one another. The third electrical interconnection 132 is formed by looping all of the gate connections together. In particular, the gate terminal pads 122 on the outer sides of the first and third ones of the discrete switching device dies 120 (e.g., on the right side of figure) are connected together by a bond wire, and the gate terminal pads 122 on the outer sides of the second and fourth ones of the discrete switching device dies 120 (e.g., on left side of figure) are connected together by a bond wire. Meanwhile, the gate terminal pads 122 on inner sides of each of the first, second, third and fourth ones of the discrete switching device dies 120 are connected directly to the central lead 106 which forms the package gate terminal 112. This forms a symmetrical loop that balances the gate signal amongst the various semiconductor dies, thereby facilitating uniform switching behavior.

In the embodiment of FIG. 6, the first and second electrical interconnections 128, 130 are provided by overlapping metal clips. In more detail, the first electrical interconnection 128 comprises a first metal clip that connects the first load terminal pads 124 from the first and third discrete switching device dies 120 together to the die pad 104 and a second metal clip that connects the first load terminal pads 124 from the second and fourth discrete switching device dies 120 together to the die pad 104. As can be seen, the die pad 104 is directly connected to the first landing pad 116 via a direct connection 138 in a similar manner as described above. In this way, die pad 104 can be used to connect the first package load terminal 108 to each of the first load terminal pads 124. The second electrical interconnection 130 comprises a third metal clip that connects the second load terminal pads 126 from the first and third discrete switching device dies 120 together and, and a fourth metal clip that electrically connects the second load terminal pads 126 from the second and fourth discrete switching device dies 120 together. The metal clips used to form the two electrical interconnections are vertically stacked on top of one another. Specifically, the third metal clip extends over and is spaced apart from the first metal clip, and the fourth metal clip extends over and is spaced apart from the second metal clip.

Figure 7:
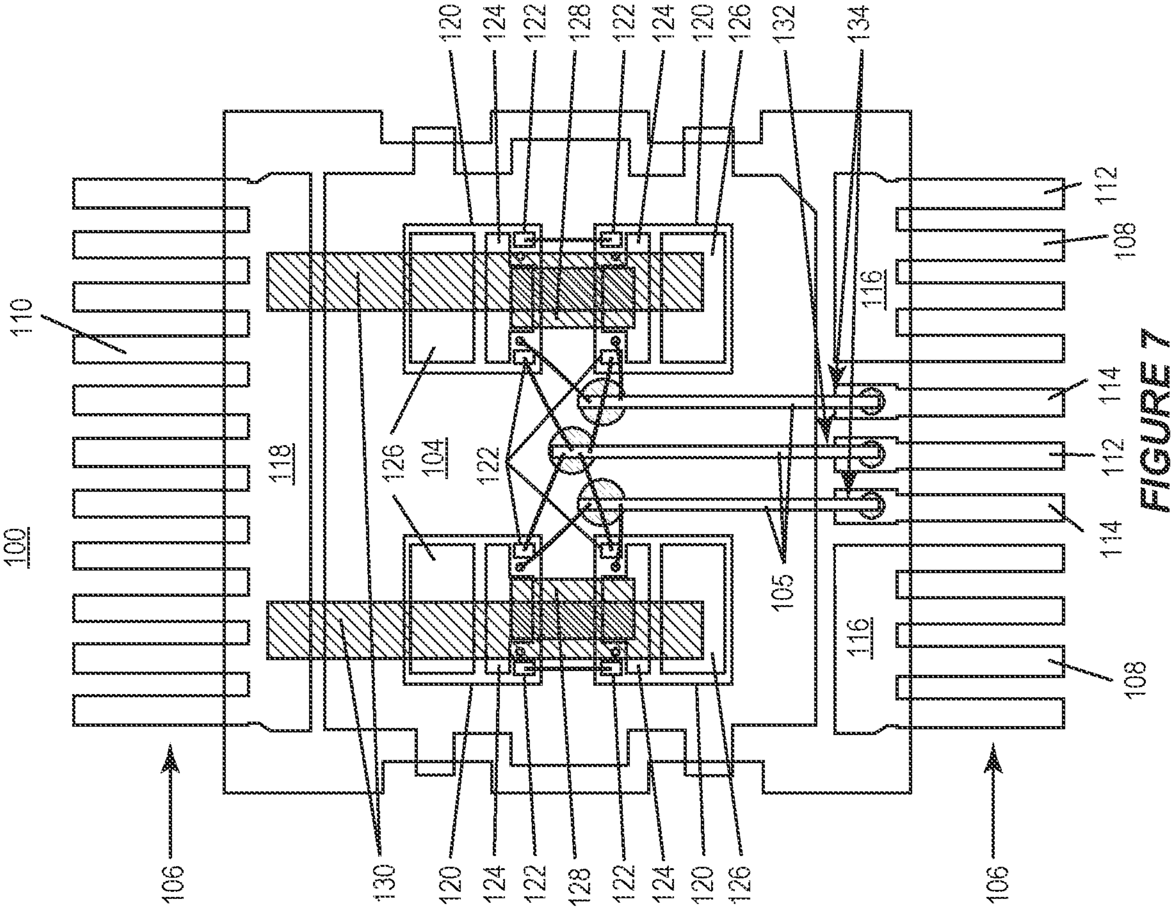

Referring to FIG. 7, the semiconductor package assembly 100 is depicted, according to another embodiment. Different to the embodiment of FIG. 6, the semiconductor package assembly 100 of FIG. 7 is configured such that the third and fourth electrical interconnections 132, 134 each comprise conductive runners 105 mounted on the die pad 104 within the central region of the semiconductor package assembly 100. In more detail, the third electrical interconnection 132 comprises a single conductive runner 105 that is arranged in a central region and extends completely to reach a landing pad associated with the package gate terminal 112. The gate terminal pads 122 from each of the first, second, third and fourth discrete switching device dies 120 are directly connected to this single conductive runner 105 by bond wires. Meanwhile, the fourth electrical interconnection 134 is provided by a pair of the conductive runners 105 arranged on either side of the central conductive runner 105. Each of these conductive runners 105 may be attached to the die pad 104 by an electrically insulating adhesive and attached to the respective landing pad by an electrically conductive adhesive. The provision of the conductive runners 105 may facilitate more uniform resistance and/or impedance matching of the third and fourth electrical interconnections 132, 134 by allowing for equal or close to equal length interconnect elements as between all four dies.

Figure 8:
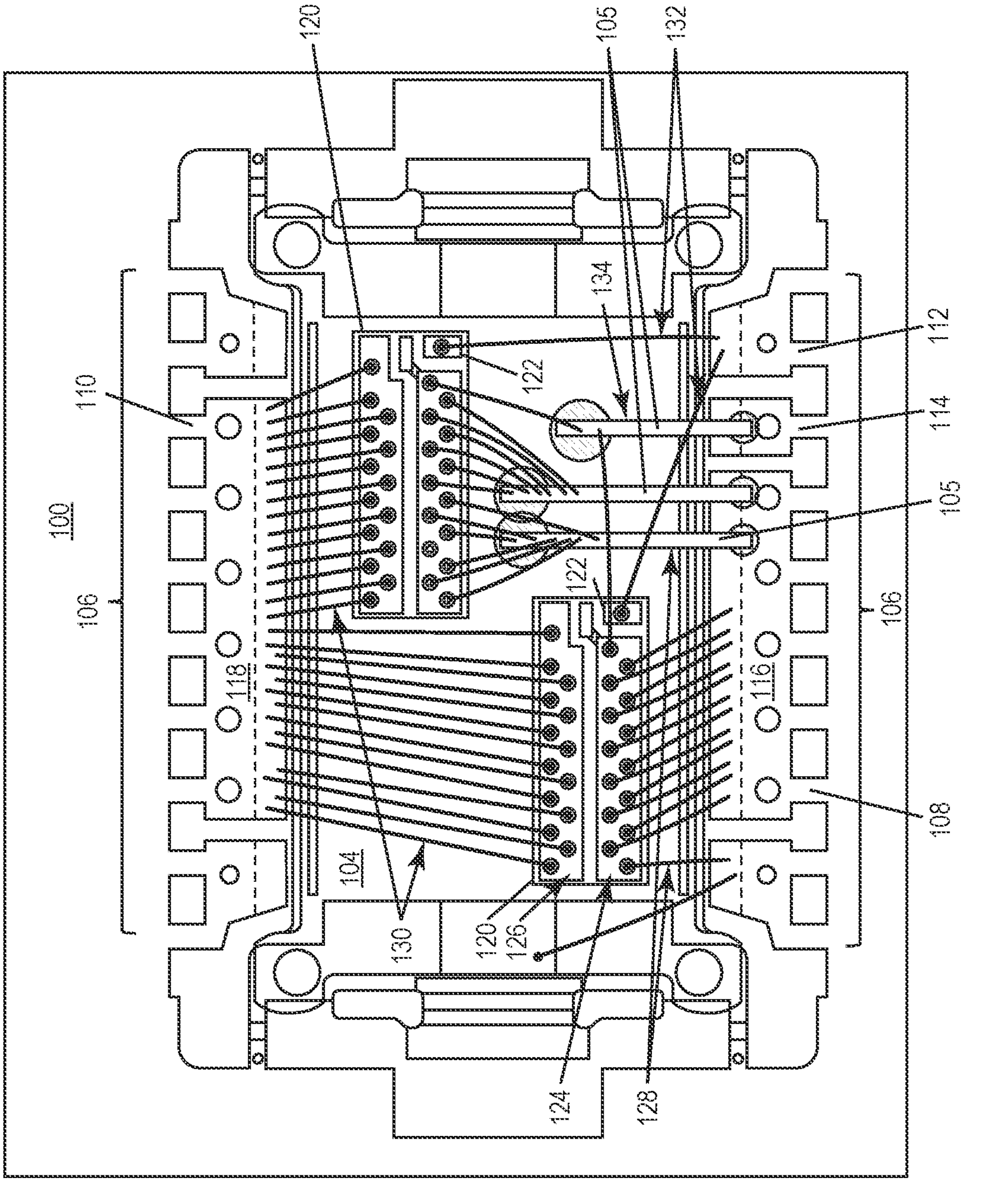

Referring to FIG. 8, a semiconductor package assembly 100 is depicted, according to another embodiment. The semiconductor package assembly 100 of FIG. 8 has a different lead frame configuration and corresponding package style as the previously depicted semiconductor package assembly 100. In this case, the die pad 104 is insufficiently large to accommodate the mounting of the discrete switching device dies 120 exactly side by side one another. Thus, as shown, the semiconductor package assembly 100 comprises a pair of the discrete switching device dies 120 arranged in a partially overlapping arrangement. In this embodiment, each of the first, second, third and fourth electrical interconnections 128, 130, 132, 134 are formed at least partially by bond wires. The lead 106 that forms the package gate terminal 112 is disposed to one side of the group of leads 106 forming the first package load terminal 108. The third electrical interconnection 132 comprises a bond wire that directly connects the gate terminal pad 122 from the first one of the discrete switching device dies 120 with the package gate terminal 112 and a second bond wire that directly connects the gate terminal pad 122 from the second one of the discrete switching device dies 120 with the package gate terminal 112. Due to the positioning of the dies, these first and second bond wires may be substantially equal in length. Meanwhile, the first electrical interconnection 128 is effectuated using a combination of bond wires and conductive runners 105. This allows for the same number of bond wires for each die to be provided within a limited area. The conductive runners 105 which form the first electrical interconnection 128 may be attached to both of the die pad 104 and the first landing pad 116 by a conductive epoxy.

Figure 9:
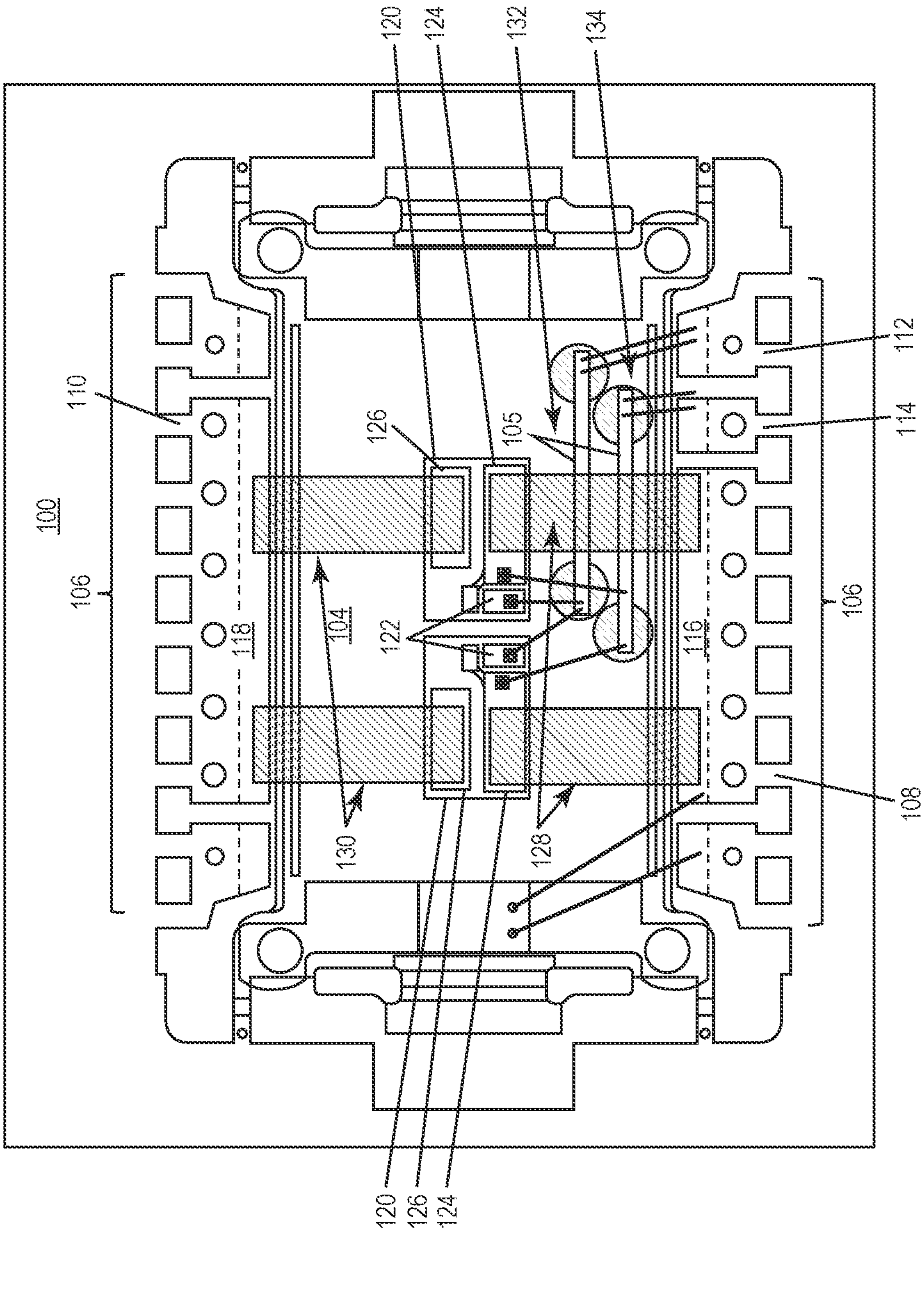

Referring to FIG. 9, a semiconductor package assembly 100 is depicted, according to another embodiment. Different to the embodiment of FIG. 8, the semiconductor package assembly 100 of FIG. 9 is configured such that the discrete switching device dies 120 are mounted side-by side one another and have different pad geometries. In particular, the pad geometries of the discrete switching device dies 120 are mirrored relative to one another in a similar manner as the embodiment of FIG. 4. Moreover, the semiconductor package assembly 100 of FIG. 9 is configured such that each of the first and second electrical interconnections 128, 130 are provided by metal clips in a similar manner as the embodiment of FIG. 4. In this case, the third electrical interconnection 132 and the fourth electrical interconnection 134 each comprise one of the conductive runners 105 mounted on and electrically insulated from the die pad 104. These conductive runners 105 are routed underneath the first metal clip and spaced apart from the first metal clip. The bond wires between each of the discrete switching device dies 120 and the conductive runner 105 from the third electrical interconnection 132 may be substantially the same length, thereby facilitating resistance and/or impedance matching.

Figure 10:
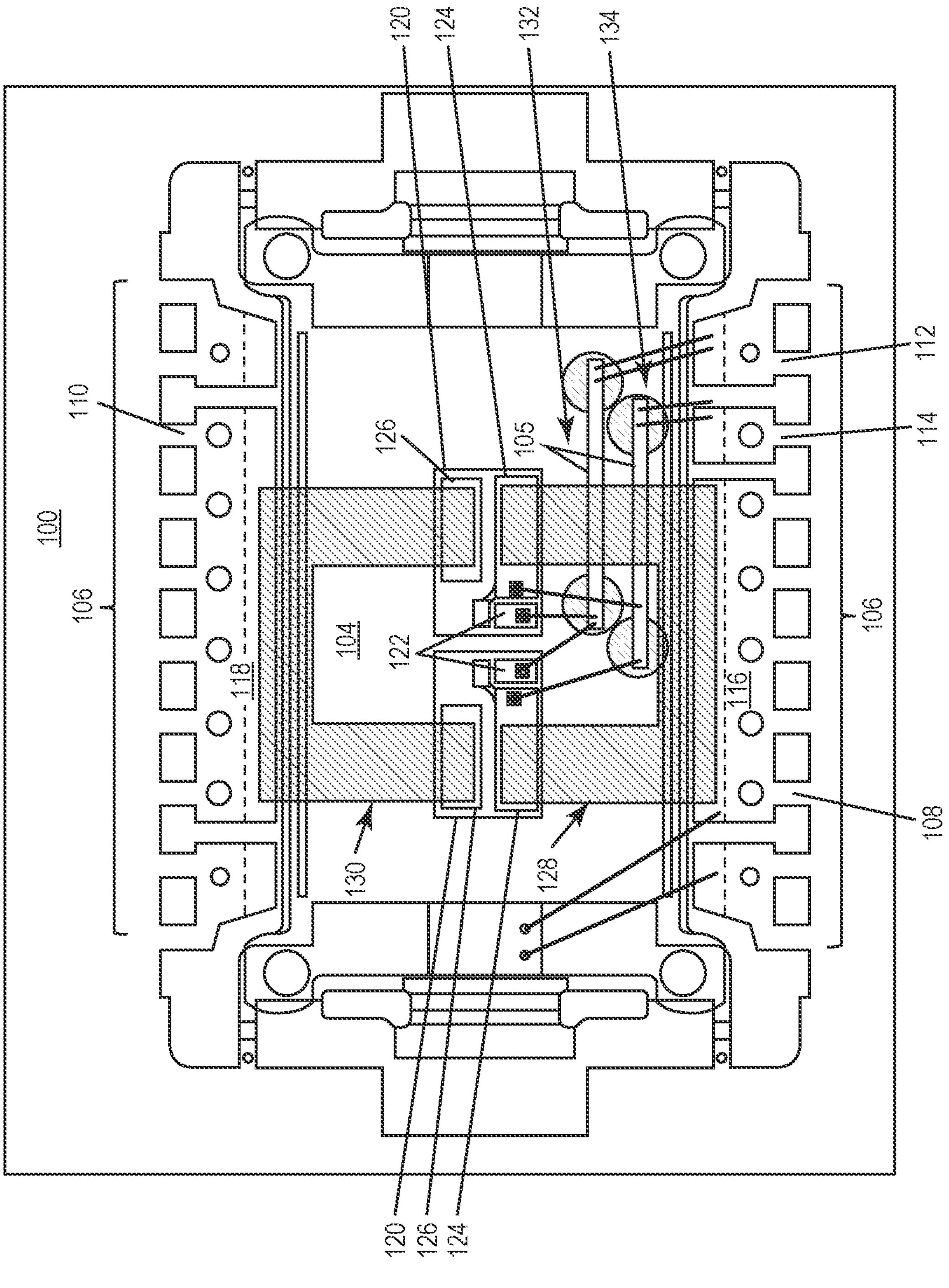

Referring to FIG. 10, a semiconductor package assembly 100 is depicted, according to another embodiment. Different to the embodiment of FIG. 9, the semiconductor package assembly 100 of FIG. 10 is configured such that the first and second electrical interconnections 128, 130 are provided by continuous metal clips that are connected to each semiconductor die. In particular, the first electrical interconnection 128 is provided by a first u-shaped clip that is connected between each of the first and second discrete switching device dies 120 and the first landing pad 116 and the second electrical connection 130 is provided by a second u-shaped clip that is connected between each of the first and second discrete switching device dies 120 and the second landing pad 118.

Figure 11:
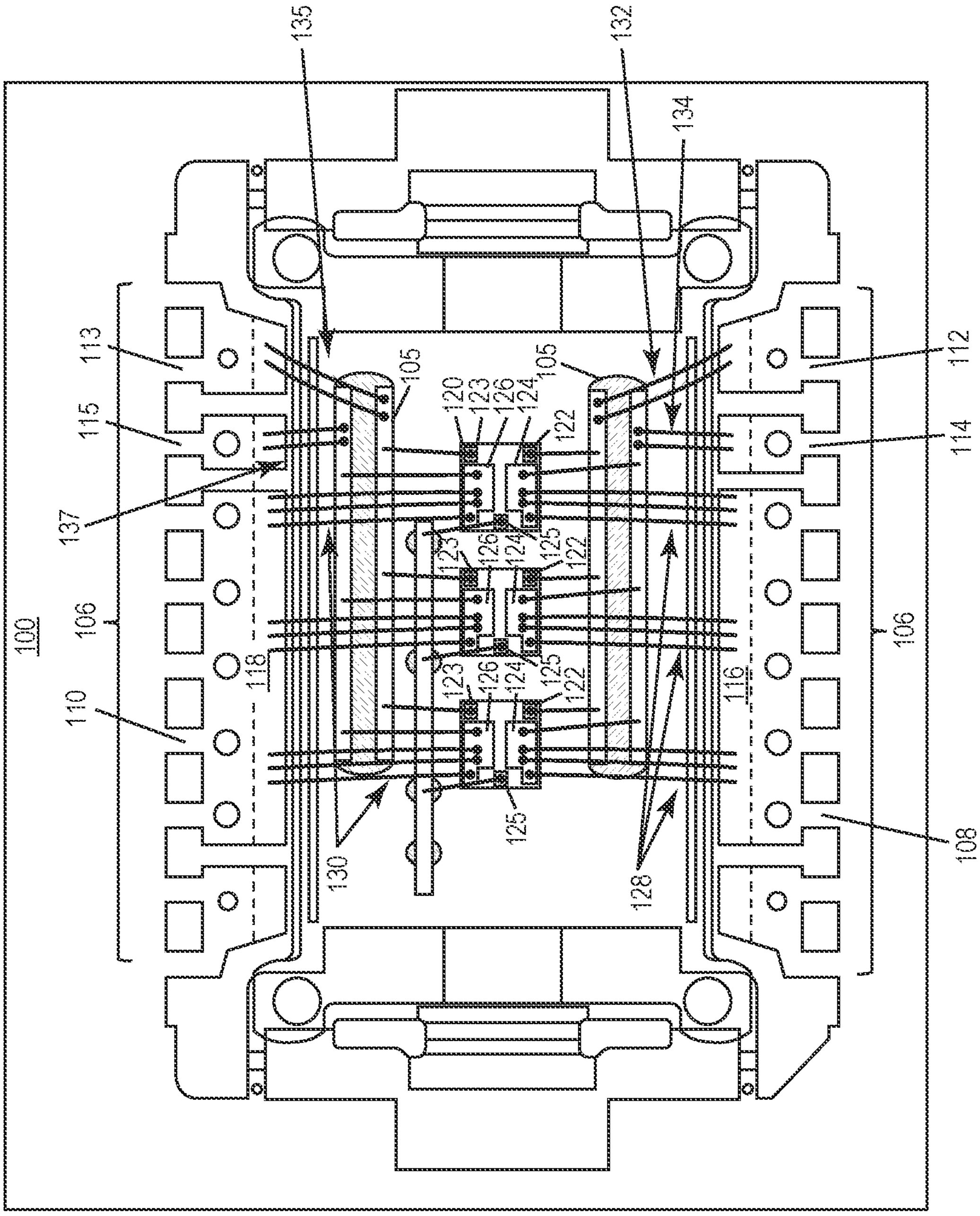

Referring to FIG. 11, a semiconductor package assembly 100 is depicted, according to another embodiment. In this case, the semiconductor package assembly 100 comprises three discrete switching device dies 120 mounted side-by side one another on the die pad 104. In this example, each of the discrete switching device dies 120 are configured as bidirectional switching devices. Different to the previously depicted device dies, each discrete switching device die 120 includes a second gate terminal pad 123. Furthermore, each discrete device die comprises a substrate connection terminal 125 disposed on the main surface of the discrete device die that faces away from the die pad 104. The semiconductor package assembly 100 is configured such that each of the three discrete switching device dies 120 are connected in parallel with one another by package level interconnections in a similar manner as described above. In this case, the semiconductor package assembly 100 comprises a second package gate terminal 113 that is electrically connected to the second gate terminal pad 123 for each of the discrete switching device dies 120 by a fifth electrical interconnection 135. In addition, the semiconductor package assembly 100 comprises a second package sense terminal 115 that is electrically connected to the second load terminal pads 126 from each of the discrete switching device dies 120 by a sixth electrical interconnection 137.

In the embodiment of FIG. 11, the semiconductor package assembly 100 comprises multi-channel conductive runners 105 disposed above and below the row of discrete switching device dies 120. The multi-channel conductive runners 105 form two separate electrical paths. The multi-channel conductive runners 105 may be provided by pairs of metal strips that are mounted using the same electrically insulating adhesive and spaced apart from one another. Alternatively, the multi-channel conductive runners 105 may be provided by discrete structures with separated spans of conductive metal and an insulating region of, e.g., plastic, epoxy, glass, etc., in between the two spans. Alternatively, the multi-channel conductive runners 105 may be provided by tracks formed in the upper metallization of a carrier. The third and fourth electrical interconnections 132, 134 of the semiconductor package assembly 100 comprises the multi-channel conductive runner 105 disposed below the semiconductor dies and the fifth and sixth electrical interconnections 135, 137 of the semiconductor package assembly 100 comprises the multi-channel conductive runner 105 disposed below the semiconductor dies.

The semiconductor package assembly 100 additionally comprises a substrate connection between the substrate connection terminals 125 of each device die and the die pad 104. The substrate connection comprises one of the conductive runners 105, with each die being connected to this conductive runner 105 by a bond wire (as shown) or other type of electrical interconnect element. The conductive runner 105 which forms part of the substrate connection may be attached by an electrically conductive epoxy, solder material, selective plating, etc.

Figure 12:
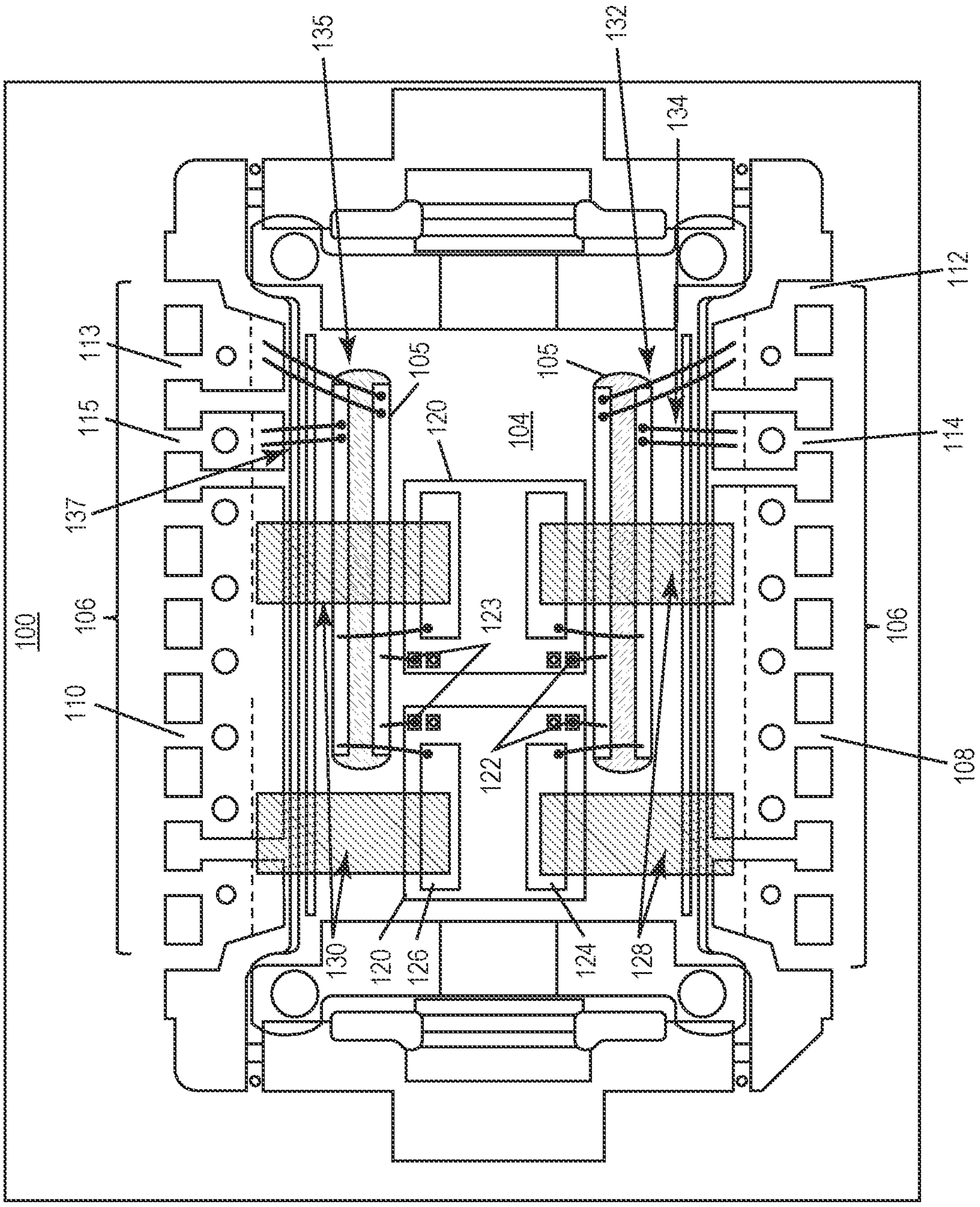

Referring to FIG. 12, a semiconductor package assembly 100 is depicted, according to another embodiment. In this case, the semiconductor package assembly 100 comprises two discrete switching device dies 120 mounted side-by side one another on the die pad 104, wherein each of the discrete switching device dies 120 are configured as bidirectional switching devices. In this case, the discrete switching device dies 120 mounted adjacent one another have mirrored pad geometries, e.g., in a similar manner as described above.

Figure 13:
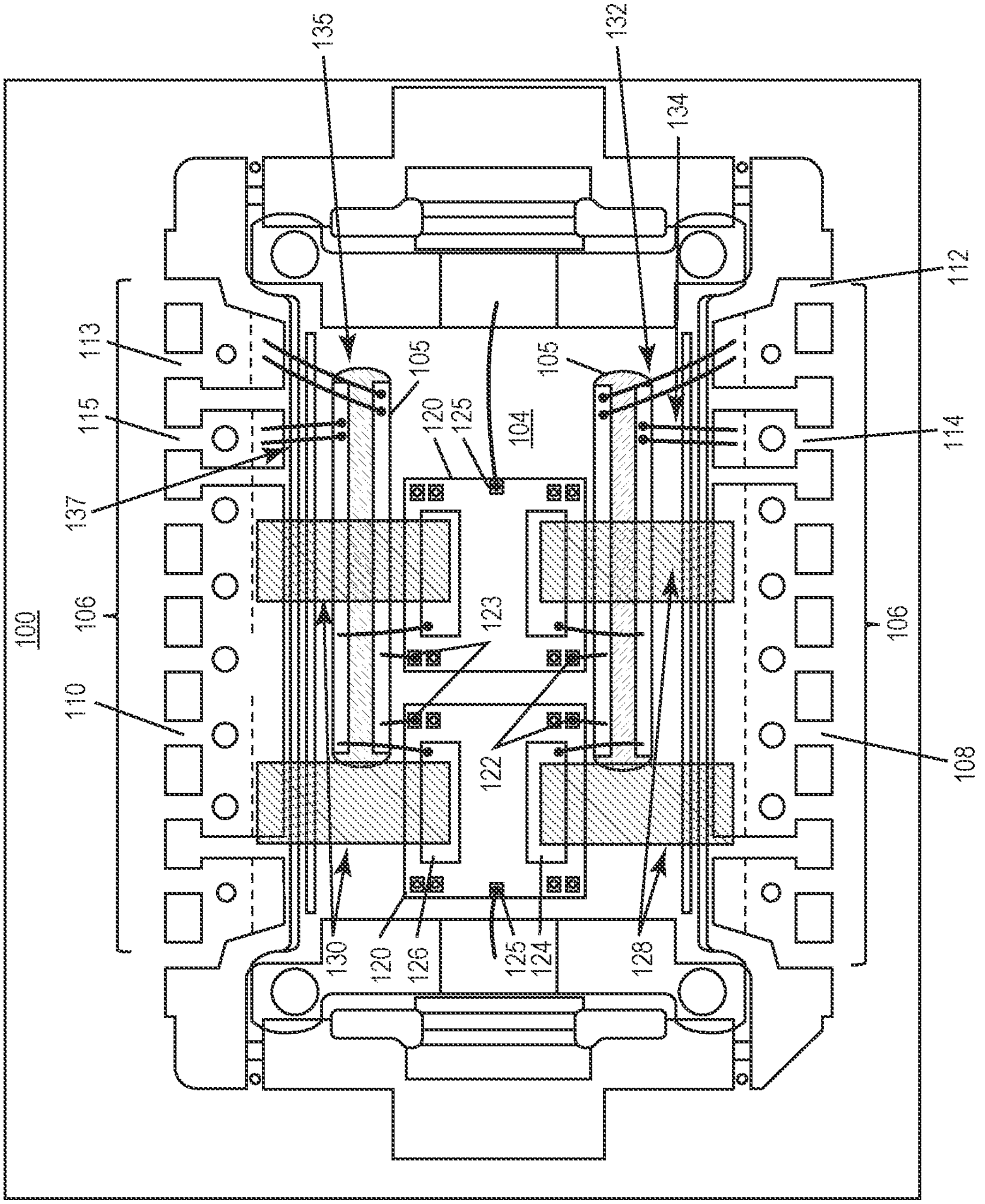

Referring to FIG. 13, a semiconductor package assembly 100 is depicted, according to another embodiment. The semiconductor package assembly 100 of FIG. 13 is substantially identical to that of FIG. 12, with the following exceptions. The discrete switching device dies 120 each comprise a substrate connection terminal 125. In this case, the substrate connection is formed by bond wires extending directly from the substrate connection terminals 125 to the lead frame. Additionally, the discrete switching device dies 120 each comprise redundant pads for each of the first and second gate terminal pads 122, 123. In addition to being connected with the package gate terminal 112 of the package and the second package gate terminal 113, the immediately adjacent gates of two device dies are directly connected to one another by using the redundant pads, thereby improving synchronous switching behavior.

Figure 14:
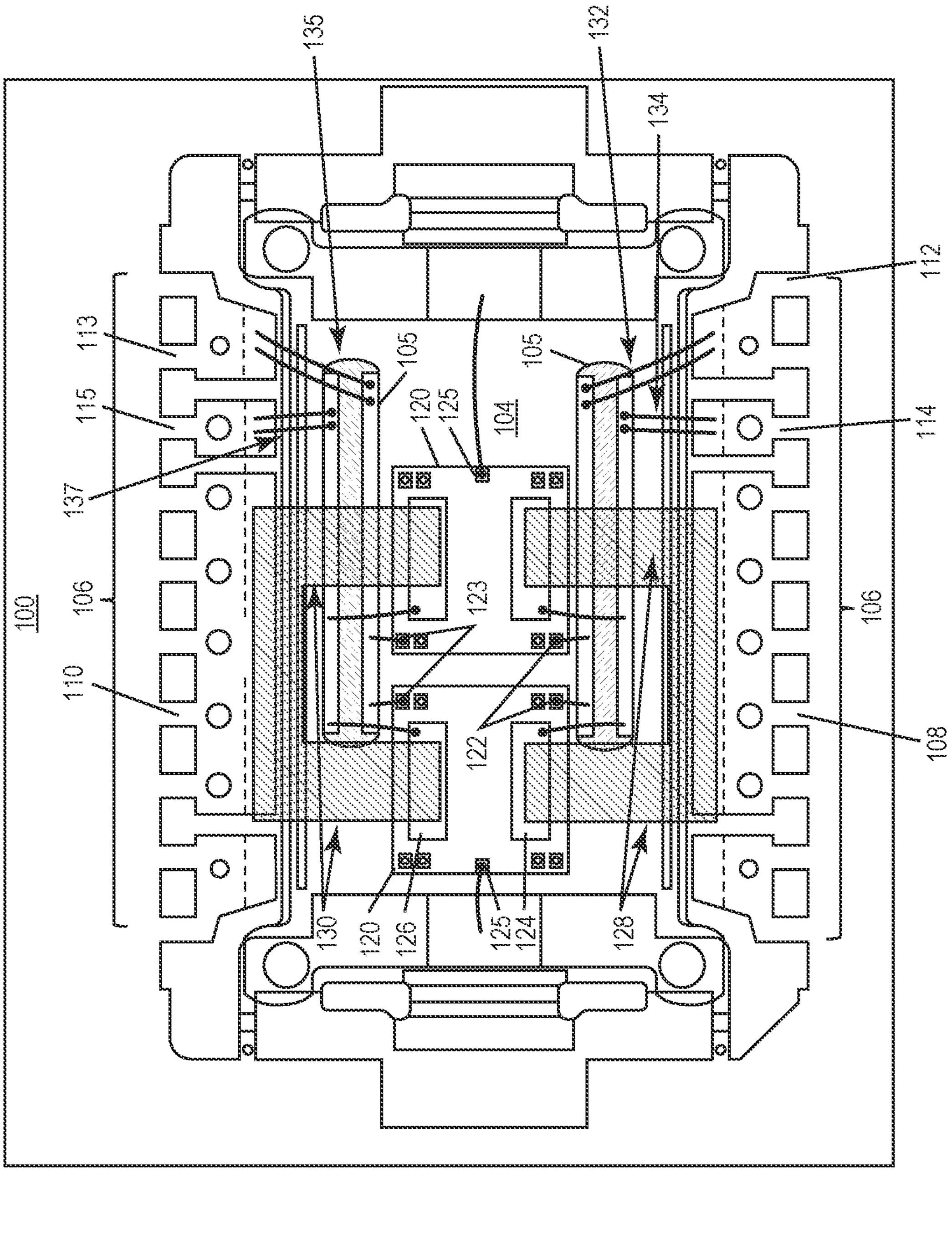

Referring to FIG. 14, a semiconductor package assembly 100 is depicted, according to another embodiment. The semiconductor package assembly 100 of FIG. 14 is substantially identical to that of FIG. 13, with the exception that the first and second electrical interconnections 128, 130 are provided by continuous metal clips that are connected to each semiconductor die. In particular, the first electrical interconnection 128 is provided by a first u-shaped clip that is connected between each of the first and second discrete switching device dies 120 and the first landing pad 116 and the second electrical interconnection 130 is provided by a second u-shaped clip that is connected between each of the first and second discrete switching device dies 120 and a second landing pad 117.

Referring to FIG. 15, a cross-sectional view of a semiconductor package 200 is shown, according to an embodiment. The semiconductor package 200 comprises a carrier comprising a die pad 104 and a plurality of leads 106 that extend away from the die pad 104. At least one discrete switching device die 120 is mounted on the die pad 104. The semiconductor package 200 comprises a first package load terminal 108 formed by one or more of the of leads 106 and a second package load terminal 110 formed by one or more of the of leads 106. A first load terminal pad 124 of the discrete switching device die 120 is electrically connected to the leads 106 which form the first package load terminal 108 by a first metal clip 202. A second load terminal pad 126 of the discrete switching device die 120 is electrically connected to the leads 106 which form the second package load terminal 110 by a second metal clip 202. An electrically insulating encapsulant body 205 encapsulates the elements mounted on the die pad 104 and associated electrical interconnect elements, while exposing outer ends of the leads 106. The encapsulant body 205 may be formed from a mold compound such as an epoxy, thermosetting plastic, etc.

According to an embodiment, the semiconductor package 200 is provided from any of the semiconductor package assemblies 100 described above wherein the first and second electrical interconnections 128, 130 are provided by metal clips. The cross-sectional view of FIG. 15 may correspond to a cross-section that intersects either one of the parallel connected dies. Further, embodiments of the semiconductor package 200 include configurations with more than two discrete switching device dies 120, e.g., as shown in the semiconductor package assemblies 100 of FIGS. 5 and 6, wherein at least the metal clips forming the second electrical interconnection 130 include the local constriction 204 to be described below. More generally, the semiconductor package 200 may correspond to any semiconductor package with at least one discrete switching device die 120 and at least one metal clip 202 with the local constriction 204 to be described below.

During operation of the semiconductor package assembly 100, significant heat is generated by the discrete switching device die 120. Some of this heat may be dissipated via the lower side of the discrete switching device die 120, which is mounted on a thermally conductive die pad 104, which in turn can be mounted on an external heat sink. However, a significant amount of heat may remain on the main surface of the discrete switching device die 120. This issue may be particularly problematic for the lateral switching device configurations disclosed herein, in particular, e.g., HEMTs and bidirectional switches formed in III-V semiconductor technology. The main surfaces of these devices may operate at temperatures on the order of 100° C. to 250° C., and more particularly in the range of about 125° C. to 150° C. in embodiments.

The metal clips 202 form a highly thermally conducive structure that can draw heat away from the main surface of the discrete switching device die 120. Indeed, the relatively large size and width of the metal clips 202 makes these types of interconnect elements attractive choices in power device applications, as they can accommodate large load currents. However, this also creates a highly thermally conductive path that much of the heat from the main surface of the discrete switching device die 120 being transferred to the lead(s) 106 to which the metal clip 202 is connected. While some heat dissipation is beneficial, too much heat transfer can cause problems when the semiconductor package 200 is mounted, as the overheating of the leads 106 may destroy or damage the lead connections, e.g., solder connections, between the semiconductor package and an external device, e.g., a PCB. Particularly in the case of package configurations that are configured to operate at high currents, this may lead to unwanted overheating that may irreparably damage the lead connections.

According to an embodiment, at least one of the metal clips 202 comprises a local constriction 204 disposed in the heat conduction path between the discrete device die and the landing pad to which it is connected. The local constriction 204 is a geometric feature in the clip whereby the cross-sectional area of the clip is locally reduced and thus the heat conductivity of the metal clip 202 is lower in comparison to the adjoining section of the clip. The local constriction 204 may correspond to a section of the metal clip 202 wherein the effective width of the metal clip 202, i.e., the total width of the clip in the heat conduction/current flow direction, is reduced. Separately or in combination, the local constriction 204 may correspond to a section of the metal clip 202 wherein the effective thickness of the metal clip 202, i.e., the total thickness of the clip in the heat conduction/current flow direction, is reduced. The presence of the local constriction 204 allows for an advantageous tradeoff between heat conduction and electrical conduction wherein the metal clip 202 can still accommodate large load currents but is sufficiently thermally resistive to prevent overheating of the leads 106 to cause damage to the lead connections.

Figure 16:
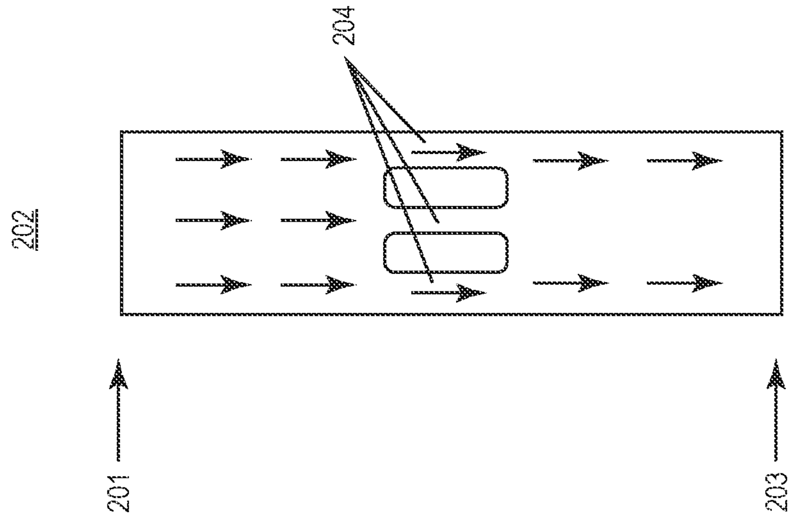
FIGS. 16-20 each illustrate embodiments of a metal interconnect clip with a local constriction, according to an embodiment.

Referring to FIG. 16, a metal clip 202 with a local constriction 204 is shown, according to an embodiment. In this case, the local constriction 204 is formed by a pair of perforations in the metal clip 202. The clip comprises a first end 201 which may be attached to a terminal of a die and a second end 203 which may be attached to a which may be attached to a lead frame surface such as a landing pad. The metal clip 202 is an elongated span of metal, e.g., copper, aluminum, nickel, etc., and alloys thereof that extends between the first end 201 and the second end 203. During operation of the device, heat flows from the first end 201 to the second end 203. In this example, the distance between the outer edge sides of the metal clip 202 remains constant throughout the length of the clip. The pair of perforations in the metal clip 202 lower the effective width of the metal clip 202 and create three of the local constrictions 204. As a result, the metal clip 202 has a greater heat resistance in the middle section comprising the local constrictions 204 than in the adjoining parts of the metal clip 202.

Figure 17:
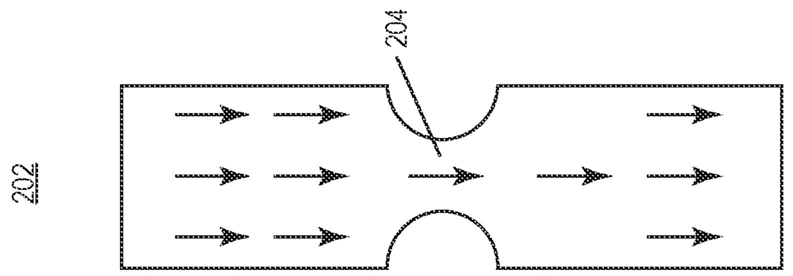

Referring to FIG. 17, a metal clip 202 with a local constriction 204 is shown, according to an embodiment. In this case, the local constriction 204 is formed by a pair grooves that are formed in the outer edge sides of the metal clip 202. In this case, the pair of the grooves are immediately opposite one another. The pair of the grooves lower the effective with of the metal clip 202 and thus increase the heat resistance in the middle section comprising the local constriction 204. The grooves may have any geometry, e.g., rectangular, triangular, etc. Moreover, the local constriction 204 may be realized by a single groove on one outer side of the metal clip 202.

Figure 18:
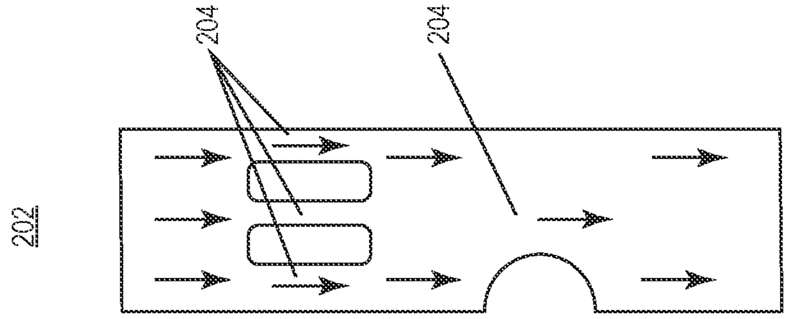

Referring to FIG. 18, a metal clip 202 with a local constriction 204 is shown, according to an embodiment. In this case, the metal clip 202 comprises constrictions 204 disposed at different length positions of the metal clip 202. In this embodiment, the metal clip 202 comprises a pair of the perforations forming a plurality of constrictions 204 at one length position and a groove forming another constriction 204 at a different length position. Thus, the metal clip 202 has a greater heat resistance in two different sections along the heat flow direction.

Figure 19:
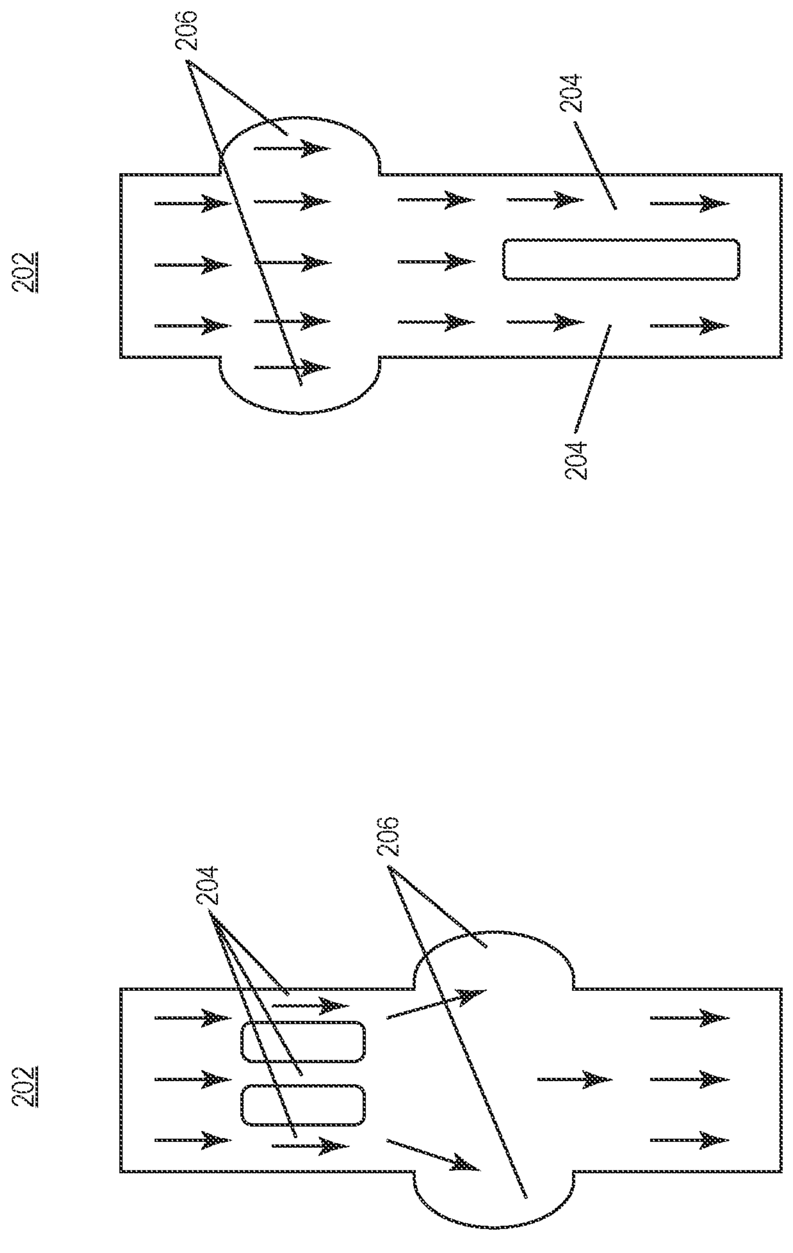

Referring to FIG. 19, a metal clip 202 with a local constriction 204 is shown, according to embodiments. In this embodiment, the metal clip 202 comprises a localized width increase 206 in addition to the local constriction 204. The localized width increase 206 refers to a section of the metal clip 202 wherein the outer edge sides of the metal clip 202 extend outward. That is, a distance between the outer edge sides of the metal clip 202 is greater in the localized width increase 206 than in other portions of the metal clip 202. As a result, the metal clip 202 has a localized increase in surface area. As evidenced by the figure, the localized width increase 206 may be provided before or after the local constriction(s) 204 in the heat flow direction and may be provided in combination with any type of geometric figure which forms the constriction 204. The localized width increase 206 may aid in the adhesion between the metal clip 202 and the surrounding encapsulant material. Separately or in combination, the localized width increase 206 may enhance the heat dissipation between the metal clip 202 and the surrounding encapsulant material, thereby further limiting the heat transfer between the die and the package leads.

Figure 20:
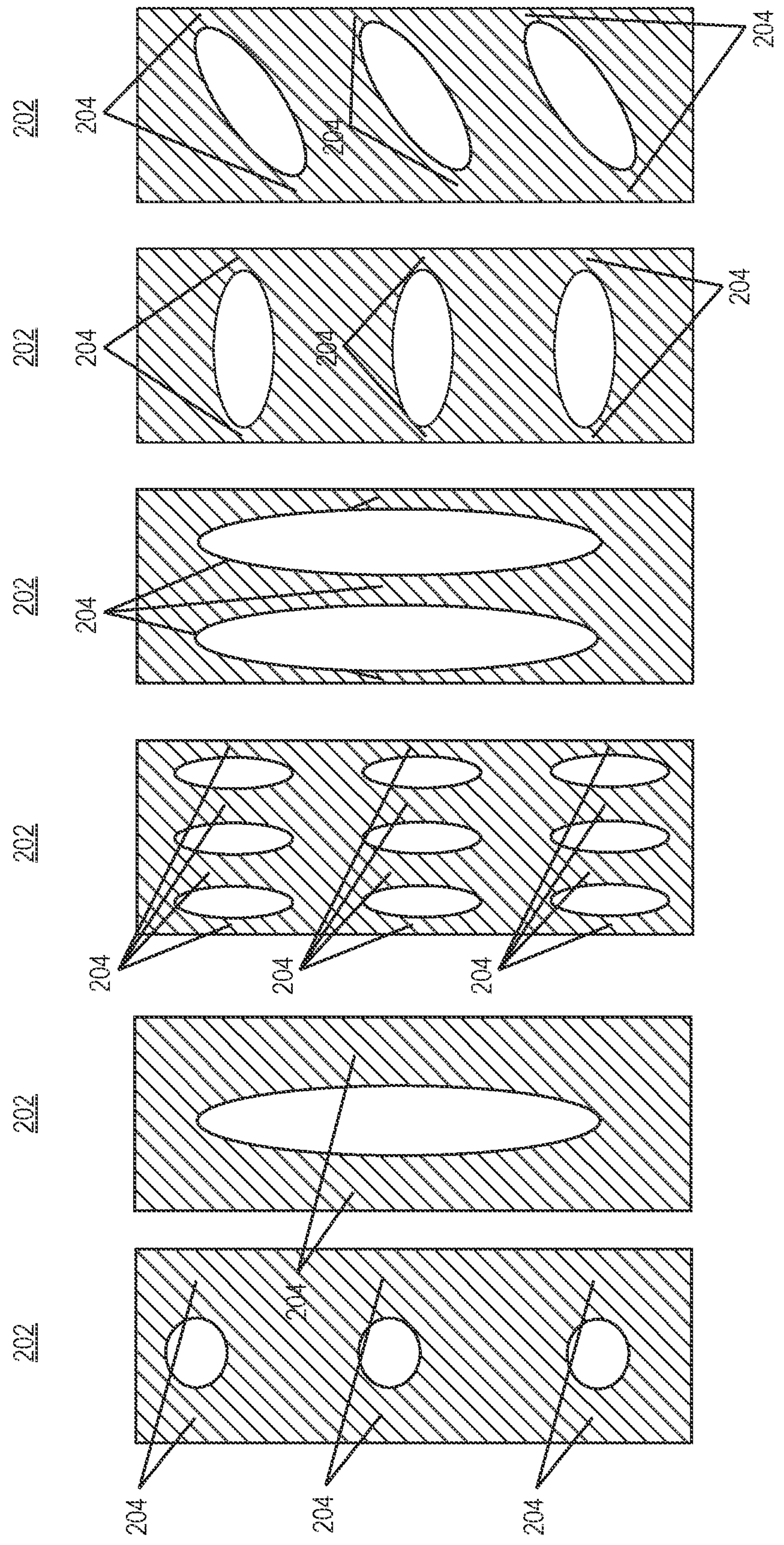

Referring to FIG. 20, various embodiments of a metal clip 202 with one or more constrictions 204 being formed by one or more perforations are shown. As can be appreciated from the figure, the geometry, size, and length position of the perforations and corresponding constrictions 204 formed by the perforations may vary. The particular design chosen may depend on, e.g., application requirements, process capability, etc. As shown, the metal clip 202 may comprise a plurality of perforations disposed at different length positions, thereby creating a plurality of the constrictions 204 at different length positions of the metal clip 202. Separately or in combination, the metal clip 202 may comprise a plurality of perforations arranged side by side one another at the same length position.

The term "interconnect element" as used herein encompasses any electrically conductive element that can be connected between two conductive regions to complete an electrical interconnection between them. Examples of interconnect elements include bond wires, ribbons and metal clips. The figures show some connections provided by a plurality of the interconnect elements connected in parallel and some connections provided by single interconnect elements. In any of the embodiments, each of these connections may be provided by a single interconnect element or by more than one interconnect element.

The term "electrically connected," "directly electrically connected" and the like refers to a low resistance connection between two elements that is ohmic, i.e., non-rectifying. This connection may be effectuated by physical contact between the concerned elements or by a conductive intermediary, such as solder, sinter, glue, etc., arranged between the concerned elements.

The term "substantially" as used herein means that the specified requirement is met to the extent made possible by manufacturing process variability. With respect to the description of substantial matching of electrical resistance and/or capacitance, substantial matching includes configurations that may deviate from one another by +/−5%.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although the present disclosure is not so limited, the following numbered examples demonstrate one or more aspects of the disclosure.

Example 1. A semiconductor package comprising: a carrier comprising a die pad and a plurality of leads; first and second switching device dies, each comprising a gate terminal pad and first and second load terminal pads disposed on a main surface; and a first package load terminal, a second package load terminal, and a package gate terminal, each of which are formed by one or more of the leads, wherein the first and second switching device dies are each configured as discrete type III-V semiconductor devices, wherein the first and second switching device dies are each mounted on the die pad with the main surfaces from each switching device die facing away from the die pad, wherein the first and second switching device dies are electrically connected in parallel, whereby: a first electrical interconnection electrically connects the first load terminal pads from the first and second switching device dies with the first package load terminal; a second electrical interconnection electrically connects the second load terminal pads from the first and second switching device dies with the second package load terminal; and a third electrical interconnection electrically connects the gate terminal pads from the first and second switching device dies with the package gate terminal.

Example 2. The semiconductor package of example 1, wherein the third electrical interconnection is configured such that: a resistance of a first gate connection that electrically connects the gate terminal pad of the first switching device die with the package gate terminal substantially matches a resistance of a second gate connection that electrically connects the gate terminal pad of the second switching device die with the package gate terminal; or an inductance of a first gate connection that electrically connects the gate terminal pad of the first switching device die with the package gate terminal substantially matches an inductance of a second gate connection that electrically connects the gate terminal pad of the second switching device die with the package gate terminal.

Example 3. The semiconductor package of example 2, wherein the third electrical interconnection comprises a conductive runner disposed on the die pad, wherein the first gate connection comprises a first bond wire directly connecting the gate terminal pad from the first switching device die with the conductive runner, and wherein the second gate connection comprises a second bond wire directly connecting the gate terminal pad from the second switching device die with the conductive runner.

Example 4. The semiconductor package of example 3, wherein the first electrical interconnection comprises a first metal clip that electrically connects the first load terminal pad from the first switching device dies with the first package load terminal, and wherein the conductive runner from the third electrical interconnection runs underneath and is electrically isolated from the first metal clip.

Example 5. The semiconductor package of example 2, wherein the first gate connection is formed by a first interconnect element directly connecting the gate terminal pad from the first switching device die with the package gate terminal, wherein the second gate connection is formed by a second interconnect element directly connecting the gate terminal pad from the second switching device die with the package gate terminal, and wherein a length of the first interconnect element substantially matches a length of the second interconnect element.

Example 6. The semiconductor package of example 5, wherein the gate terminal pad from the first switching device die and the gate terminal pad from the second switching device die are positioned adjacent to sides of the first and second switching device dies that face one another.

Example 7. The semiconductor package of example 6, wherein each of the first and second switching device dies have an asymmetric pad geometry.

Example 8. The semiconductor package of example 6, wherein each of the first and second switching device dies have an identical pad geometry, and wherein each of the first and second switching device dies comprise two of the gate terminal pad positioned adjacent to both sides of the respective switching device die.

Example 9. The semiconductor package of example 5, wherein the first electrical interconnection comprises a first metal clip that electrically connects the first load terminal pad from the first switching device die with the first package load terminal a second metal clip that electrically connects the first load terminal pad from the second switching device die with the first package load terminal, and wherein the first and second interconnect elements that are disposed within a central area of the semiconductor package that is between the first and second metal clips.

Example 10. The semiconductor package of example 2, wherein the carrier further comprises a first landing pad arranged between the die pad and the leads which form the first package load terminal, wherein the first package load terminal is formed by a plurality of the leads that merge with the first landing pad, and wherein the carrier comprises a direct connection between the die pad and the first landing pad.

Example 11. The semiconductor package of example 1, further comprising: third and fourth switching device dies, each comprising a gate terminal pad and first and second load terminal pads disposed on a main surface, wherein the first and second switching device dies are each configured as discrete type III-V semiconductor devices, wherein the first, second, third and fourth switching device dies are each electrically connected in parallel, whereby: the first electrical interconnection electrically connects the first load terminal pads from the first, second, third and fourth switching device dies with the first package load terminal; the second electrical interconnection electrically connects the second load terminal pads from the first, second, third and fourth switching device dies with the second package load terminal; and the third electrical interconnection electrically connects the gate terminal pads from the first, second, third and fourth switching device dies with the package gate terminal.

Example 12. The semiconductor package of example 11, wherein the third electrical interconnection is configured such that resistances of each gate connection that electrically connects the gate terminal pads from each of the first, second, third and fourth switching device dies with the package gate terminal substantially match one another.

Example 13. The semiconductor package of example 12, and wherein the first electrical interconnection comprises a first metal clip that connects the first load terminal pads from the first and third switching device dies together to the die pad and a second metal clip that connects the first load terminal pads from the second and fourth switching device dies together to the die pad, and wherein the second electrical interconnection comprises a third metal clip that connects the second load terminal pads from the first and third switching device dies together and extends over the first metal clip, and a fourth metal clip that electrically connects the second load terminal pads from the second and fourth switching device dies together and extends over the second metal clip.

Example 14. The semiconductor package of example 13, wherein the third electrical interconnection is formed by a group of electrical interconnect elements that are disposed within a central area of the semiconductor package that is between each of the first, second, third and fourth metal clips.

Example 15. The semiconductor package of example 1, wherein the first electrical interconnection comprises a continuous metal clip that directly connects the first load terminal pads from both of the first switching device die with the first package load terminal, and wherein the second electrical interconnection comprises a continuous metal clip that directly connects the second load terminal pads from both of the first switching device die with the second package load terminal.

Example 16. The semiconductor package of example 1, wherein the first and second switching device dies are each configured as high electron mobility transistor dies.

Example 17. The semiconductor package of example 1, wherein the first and second switching device dies are each configured as bidirectional switches, wherein the first and second switching device dies each comprise a second gate terminal pad, wherein the semiconductor package comprises a second package gate terminal formed by one or more of the leads, and a fourth electrical interconnection that electrically connects the second gate terminal pads from the first and second switching device dies with the second package gate terminal.

Example 18. The semiconductor package of example 17, wherein the first electrical interconnection comprises a first group of bond wires that directly connects the first load terminal pads from the first switching device die to the first package load terminal, a conductive runner directly connected to the first package load terminal, and a second group of bond wires that directly connects the first load terminal pads from the second switching device die to the conductive runner.

Example 19. The semiconductor package of example 17, wherein the first and second switching device dies each comprise a second gate terminal pad, wherein the semiconductor package further comprises a second package gate terminal formed by one or more of the leads and a fifth electrical interconnection that electrically connects the second gate terminal pads from the first and second switching device dies with the second package gate terminal, and wherein each of the third and fifth electrical connections comprise a multi-channel conductive runner.

Example 20. The semiconductor package of example 19, wherein the first and second switching device dies each comprise substrate connection terminal pad, and wherein the substrate connection terminal pad from each of the first and second switching device dies is electrically connected to the die pad.

Example 21. The semiconductor package of example 20, wherein the semiconductor package further comprises a conductive runner mounted on and electrically connected to the die pad, and wherein the substrate connection terminal pad from each of the first and second switching device dies is electrically connected to the conductive runner by electrical interconnect elements.

Example 22. The semiconductor package of example 1, wherein the semiconductor package further comprises a package sense terminal formed by one or more of the leads, and wherein the semiconductor package further comprises a fourth electrical interconnection that electrically connects the second load terminal pads from the first and second switching device dies with the package sense terminal.

Example 23. The semiconductor package of example 22, wherein the fourth electrical interconnection is configured such that: a resistance of a first sense connection that electrically connects the second terminal pad of the first switching device die with the package sense terminal substantially matches a resistance of a second sense connection that electrically connects the second terminal pad of the second switching device die with the package sense terminal; or an inductance of a first sense connection that electrically connects the second terminal pad of the first switching device die with the package sense terminal substantially matches an inductance of a second sense connection that electrically connects the second terminal pad of the second switching device die with the package sense terminal.

Example 24. The semiconductor package of example 1, wherein the first electrical interconnection comprises a first metal clip that electrically connects the first load terminal pad from the first switching device die with the first package load terminal, and wherein the first metal clip comprises a local constriction that is configured to locally reduce a heat conductance of the first metal clip in a section of the first metal clip that is between the first switching device die and the first package load terminal.

Example 25. The semiconductor package of example 24, wherein the wherein the local constriction is formed by at least one of: a perforation that is spaced apart from outer edge sides of the first metal clip; and a groove formed in one of the outer edge sides of the first metal clip.

Example 26. The semiconductor package of example 24, wherein the first electrical interconnection comprises a second metal clip that electrically connects the first load terminal pad from the second switching device die with the first package load terminal, and wherein the second metal clip comprises a local constriction configured to locally reduce a heat conductance of the second metal clip in a section of the second metal clip that is between the second switching device die and the first package load terminal.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package comprising:

a carrier comprising a die pad and a plurality of leads;

first and second switching device dies, each comprising a gate terminal pad and first and second load terminal pads disposed on a main surface; and a first package load terminal, a second package load terminal, and a package gate terminal, each of which is formed by one or more of the leads, wherein the first and second switching device dies are each configured as a discrete type III-V semiconductor device, wherein the first and second switching device dies are each mounted on the die pad with the main surfaces from each switching device die facing away from the die pad, wherein the first and second switching device dies are electrically connected in parallel, whereby:

a first electrical interconnection electrically connects the first load terminal pads from the first and second switching device dies with the first package load terminal;

a second electrical interconnection electrically connects the second load terminal pads from the first and second switching device dies with the second package load terminal; and a third electrical interconnection electrically connects the gate terminal pads from the first and second switching device dies with the package gate terminal.

2. The semiconductor package of claim 1, wherein the third electrical Interconnection is configured such that:

a resistance of a first gate connection that electrically connects the gate terminal pad of the first switching device die with the package gate terminal substantially matches a resistance of a second gate connection that electrically connects the gate terminal pad of the second switching device die with the package gate terminal; or an inductance of a first gate connection that electrically connects the gate terminal pad of the first switching device die with the package gate terminal substantially matches an inductance of a second gate connection that electrically connects the gate terminal pad of the second switching device die with the package gate terminal.

3. The semiconductor package of claim 2, wherein the third electrical Interconnection comprises a conductive runner disposed on the die pad, wherein the first gate connection comprises a first bond wire directly connecting the gate terminal pad from the first switching device die with the conductive runner, and wherein the second gate connection comprises a second bond wire directly connecting the gate terminal pad from the second switching device die with the conductive runner.

4. The semiconductor package of claim 3, wherein the first electrical interconnection comprises a first metal clip that electrically connects the first load terminal pad from the first switching device die with the first package load terminal, and wherein the conductive runner from the third electrical interconnection runs underneath and is electrically isolated from the first metal clip.

5. The semiconductor package of claim 2, wherein the first gate connection is formed by a first interconnect element directly connecting the gate terminal pad from the first switching device die with the package gate terminal, wherein the second gate connection is formed by a second interconnect element directly connecting the gate terminal pad from the second switching device die with the package gate terminal, and wherein a length of the first interconnect element substantially matches a length of the second interconnect element.

6. The semiconductor package of claim 5, wherein the gate terminal pad from the first switching device die and the gate terminal pad from the second switching device die are positioned adjacent to sides of the first and second switching device dies that face one another.

7. The semiconductor package of claim 6, wherein each of the first and second switching device dies has an asymmetric pad geometry.

8. The semiconductor package of claim 6, wherein each of the first and second switching device dies has an identical pad geometry, and wherein each of the first and second switching device dies comprises two of the gate terminal pad positioned adjacent to both sides of the respective switching device die.

9. The semiconductor package of claim 5, wherein the first electrical interconnection comprises a first metal clip that electrically connects the first load terminal pad from the first switching device die with the first package load terminal a second metal clip that electrically connects the first load terminal pad from the second switching device die with the first package load terminal, and wherein the first and second interconnect elements are disposed within a central area of the semiconductor package that is between the first and second metal clips.

10. The semiconductor package of claim 2, wherein the carrier further comprises a first landing pad arranged between the die pad and the leads which form the first package load terminal, wherein the first package load terminal is formed by a plurality of the leads that merge with the first landing pad, and wherein the carrier comprises a direct connection between the die pad and the first landing pad.

11. The semiconductor package of claim 1, further comprising:

third and fourth switching device dies, each comprising a gate terminal pad and first and second load terminal pads disposed on a main surface, wherein the third and fourth switching device dies are each configured as a discrete type III-V semiconductor device, wherein the first, second, third and fourth switching device dies are each electrically connected in parallel, whereby:

the first electrical interconnection electrically connects the first load terminal pads from the first, second, third and fourth switching device dies with the first package load terminal;

the second electrical interconnection electrically connects the second load terminal pads from the first, second, third and fourth switching device dies with the second package load terminal; and the third electrical interconnection electrically connects the gate terminal pads from the first, second, third and fourth switching device dies with the package gate terminal.

12. The semiconductor package of claim 11, wherein the third electrical interconnection is configured such that resistances of each gate connection that electrically connects the gate terminal pads from each of the first, second, third and fourth switching device dies with the package gate terminal substantially match one another.

13. The semiconductor package of claim 12, wherein the first electrical interconnection comprises a first metal clip that connects the first load terminal pads from the first and third switching device dies together to the die pad and a second metal clip that connects the first load terminal pads from the second and fourth switching device dies together to the die pad, and wherein the second electrical interconnection comprises a third metal clip that connects the second load terminal pads from the first and third switching device dies together and extends over the first metal clip, and a fourth metal clip that electrically connects the second load terminal pads from the second and fourth switching device dies together and extends over the second metal clip.

14. The semiconductor package of claim 13, wherein the third electrical Interconnection is formed by a group of electrical interconnect elements that are disposed within a central area of the semiconductor package that is between each of the first, second, third and fourth metal clips.

15. The semiconductor package of claim 1, wherein the first electrical interconnection comprises a continuous metal clip that directly connects the first load terminal pads from both of the first and second switching device dies with the first package load terminal, and wherein the second electrical interconnection comprises a continuous metal clip that directly connects the second load terminal pads from both of the first and second switching device dies with the second package load terminal.

16. The semiconductor package of claim 1, wherein the first and second switching device dies are each configured as a high electron mobility transistor die.

17. The semiconductor package of claim 1, wherein the first and second switching device dies are each configured as a bidirectional switch, wherein the first and second switching device dies each comprise a second gate terminal pad, wherein the semiconductor package comprises a second package gate terminal formed by one or more of the leads, and a fourth electrical interconnection that electrically connects the second gate terminal pads from the first and second switching device dies with the second package gate terminal.

18. The semiconductor package of claim 17, wherein the first electrical interconnection comprises a first group of bond wires that directly connects the first load terminal pads from the first switching device die to the first package load terminal, a conductive runner directly connected to the first package load terminal, and a second group of bond wires that directly connects the first load terminal pads from the second switching device die to the conductive runner.

19. The semiconductor package of claim 17, wherein the first and second switching device dies each comprise a second gate terminal pad, wherein the semiconductor package further comprises a second package gate terminal formed by one or more of the leads and a fifth electrical interconnection that electrically connects the second gate terminal pads from the first and second switching device dies with the second package gate terminal, and wherein each of the third and fifth electrical connections comprises a multi-channel conductive runner.

20. The semiconductor package of claim 19, wherein the first and second switching device dies each comprise a substrate connection terminal pad, and wherein the substrate connection terminal pad from each of the first and second switching device dies is electrically connected to the die pad.

21. The semiconductor package of claim 20, wherein the semiconductor package further comprises a conductive runner mounted on and electrically connected to the die pad, and wherein the substrate connection terminal pad from each of the first and second switching device dies is electrically connected to the conductive runner by electrical interconnect elements.

22. The semiconductor package of claim 1, wherein the semiconductor package further comprises a package sense terminal formed by one or more of the leads, and wherein the semiconductor package further comprises a fourth electrical Interconnection that electrically connects the second load terminal pads from the first and second switching device dies with the package sense terminal.

23. The semiconductor package of claim 22, wherein the fourth electrical interconnection is configured such that:

a resistance of a first sense connection that electrically connects the second load terminal pad of the first switching device die with the package sense terminal substantially matches a resistance of a second sense connection that electrically connects the second load terminal pad of the second switching device die with the package sense terminal; or an inductance of a first sense connection that electrically connects the second load terminal pad of the first switching device die with the package sense terminal substantially matches an inductance of a second sense connection that electrically connects the second load terminal pad of the second switching device die with the package sense terminal.

24. The semiconductor package of claim 1, wherein the first electrical Interconnection comprises a first metal clip that electrically connects the first load terminal pad from the first switching device die with the first package load terminal, and wherein the first metal clip comprises a local constriction that is configured to locally reduce a heat conductance of the first metal clip in a section of the first metal clip that is between the first switching device die and the first package load terminal.

25. The semiconductor package of claim 24, wherein the local constriction is formed by at least one of:

a perforation that is spaced apart from outer edge sides of the first metal clip; and a groove formed in one of the outer edge sides of the first metal clip.

26. The semiconductor package of claim 24, wherein the first electrical interconnection comprises a second metal clip that electrically connects the first load terminal pad from the second switching device die with the first package load terminal, and wherein the second metal clip comprises a local constriction configured to locally reduce a heat conductance of the second metal clip in a section of the second metal clip that is between the second switching device die and the first package load terminal.

* * * * *